(12) United States Patent
Suzuki et al.

(10) Patent No.: US 10,547,324 B2
(45) Date of Patent: Jan. 28, 2020

(54) DATA COMPRESSION CODING METHOD, APPARATUS THEREFOR, AND PROGRAM THEREFOR

(71) Applicants: KOUSOKUYA, INC., Kanagawa (JP); DENSO CORPORATION, Aichi (JP)

(72) Inventors: Takayuki Suzuki, Kanagawa (JP); Kaoru Shibata, Kanagawa (JP)

(73) Assignees: KOUSOKUYA, INC., Kanagawa (JP); DENSO CORPORATION, Aichi (JP)

( * ) Notice: Subject to any disclaimer, the term of this patent is extended or adjusted under 35 U.S.C. 154(b) by 0 days.

(21) Appl. No.: 16/235,741

(22) Filed: Dec. 28, 2018

(65) Prior Publication Data

US 2019/0140657 A1     May 9, 2019

Related U.S. Application Data

(63) Continuation of application No. PCT/JP2017/025955, filed on Jul. 18, 2017.

(51) Int. Cl.

| | |
|---|---|
| *H03M 7/34* | (2006.01) |
| *H03M 7/30* | (2006.01) |
| *H03M 7/40* | (2006.01) |
| *H04N 19/137* | (2014.01) |
| *G06K 9/38* | (2006.01) |
| *H03M 7/00* | (2006.01) |

(52) U.S. Cl.
CPC .......... *H03M 7/3084* (2013.01); *H03M 7/40* (2013.01); *H03M 7/4006* (2013.01); *H03M 7/6035* (2013.01); *G06K 9/38* (2013.01); *H03M 7/00* (2013.01); *H03M 7/30* (2013.01); *H04N 19/137* (2014.11)

(58) Field of Classification Search
CPC . H03M 7/00; H03M 7/30; G06K 9/38; H04N 19/137
USPC .............. 341/51, 50, 87; 375/240.03, 240.16
See application file for complete search history.

(56) References Cited

U.S. PATENT DOCUMENTS

2015/0331025 A1* 11/2015 Arashima ............ G01R 15/142
702/62

FOREIGN PATENT DOCUMENTS

| JP | 2007-214812 A | 8/2007 |
|---|---|---|
| JP | 2007-221280 A | 8/2007 |
| JP | 2010-026884 A | 2/2010 |
| JP | 2011-048514 A | 3/2011 |

(Continued)

OTHER PUBLICATIONS

International Search Report issued in Application No. PCT/JP2017/025955, dated Sep. 26, 2017.

*Primary Examiner* — Joseph J Lauture
(74) *Attorney, Agent, or Firm* — Michael Best & Friedrich LLP

(57) ABSTRACT

A compression coding method, apparatus, and program suitable for continuously coding pieces of fixed length data are provided. The compression coding method includes: dividing, into columns each with a predetermined bit width, records consisting of a fixed-length bit string that includes one or more fields, pieces of data of the same type being contained in the same field among fields determined in advance; and determining, for each column, a probability of occurrence of a bit value in the column at the same position among a plurality of records, and coding the plurality of records on the basis of the probability of occurrence using an entropy coding method.

9 Claims, 51 Drawing Sheets

(56) References Cited

FOREIGN PATENT DOCUMENTS

WO    WO-2013/175909 A1    11/2013

* cited by examiner

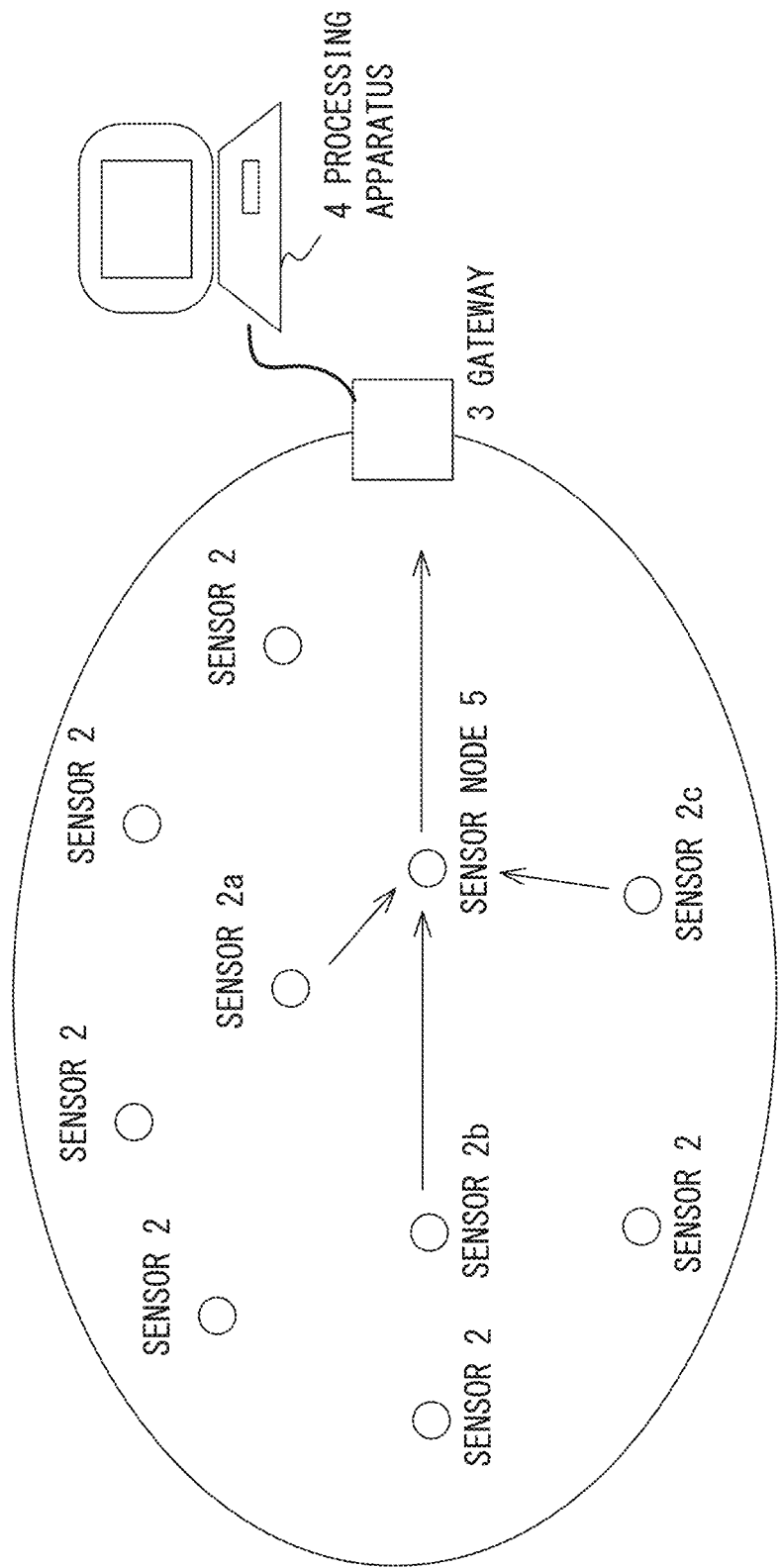

FIG. 2A

● DECIMAL NOTATION
TIME[HOUR, MINUTE, SECOND, MILLISECOND(26bit)], ROTATION PULSE NUMBER(14bit), SENSOR2b ON/OFF(1bit), SENSOR2c ON/OFF(1bit)
10235903, 1203, 0, 0
10235913, 1052, 0, 0
10235923, 967, 0, 1
10235933, 998, 0, 1
10235943, 1060, 0, 1

FIG. 2B

● BINARY NOTATION
TIME(26bit), ROTATION PULSE NUMBER(14bit), SENSOR2b ON/OFF(1bit), SENSOR2c ON/OFF(1bit)
00100111000010101111111111111, 00010010101110011, 0 , 0
00100111000010001100000001001, 00010000001100, 0 , 0
00100111000011000000000010011, 00001111000111, 0 , 1
00100111000011000000000011101, 00001111100110, 0 , 1
00100111000011000000000100111, 00010000100100, 0 , 1

FIG. 2C

● BINARY NOTATION(REPRESENTED AS CONTINUOUS DATA)
TIME(26bit), ROTATION PULSE NUMBER(14bit), SENSOR2b ON/OFF(1bit), SENSOR2c ON/OFF(1bit)
0010011100001010111111111111100010010101110011001100
0010011100001000110000000100100010000001100000000
0010011100001100000000001001100001111000111001
0010011100001100000000001110100001111100110001
0010011100001100000000010011100010000100100001

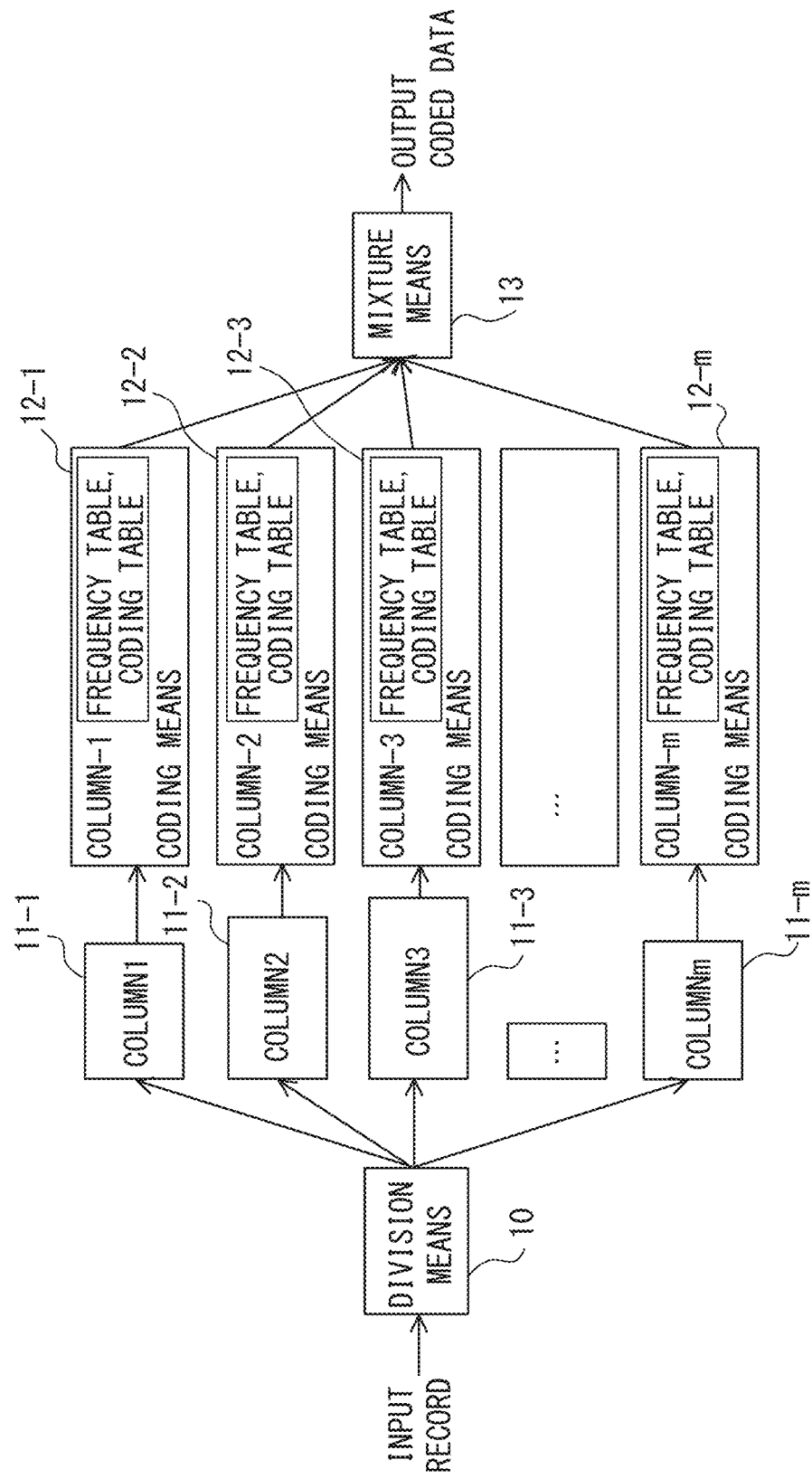

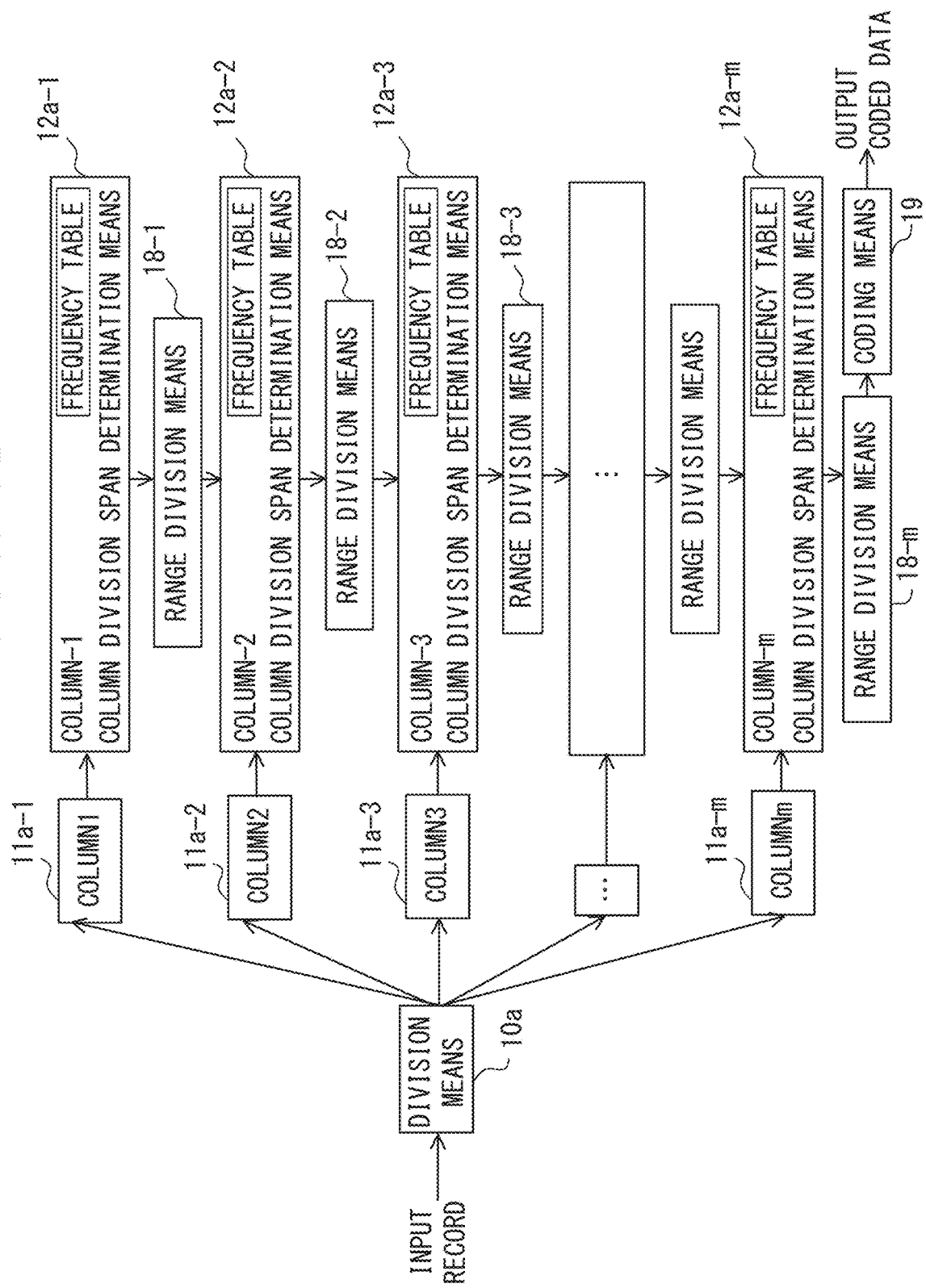

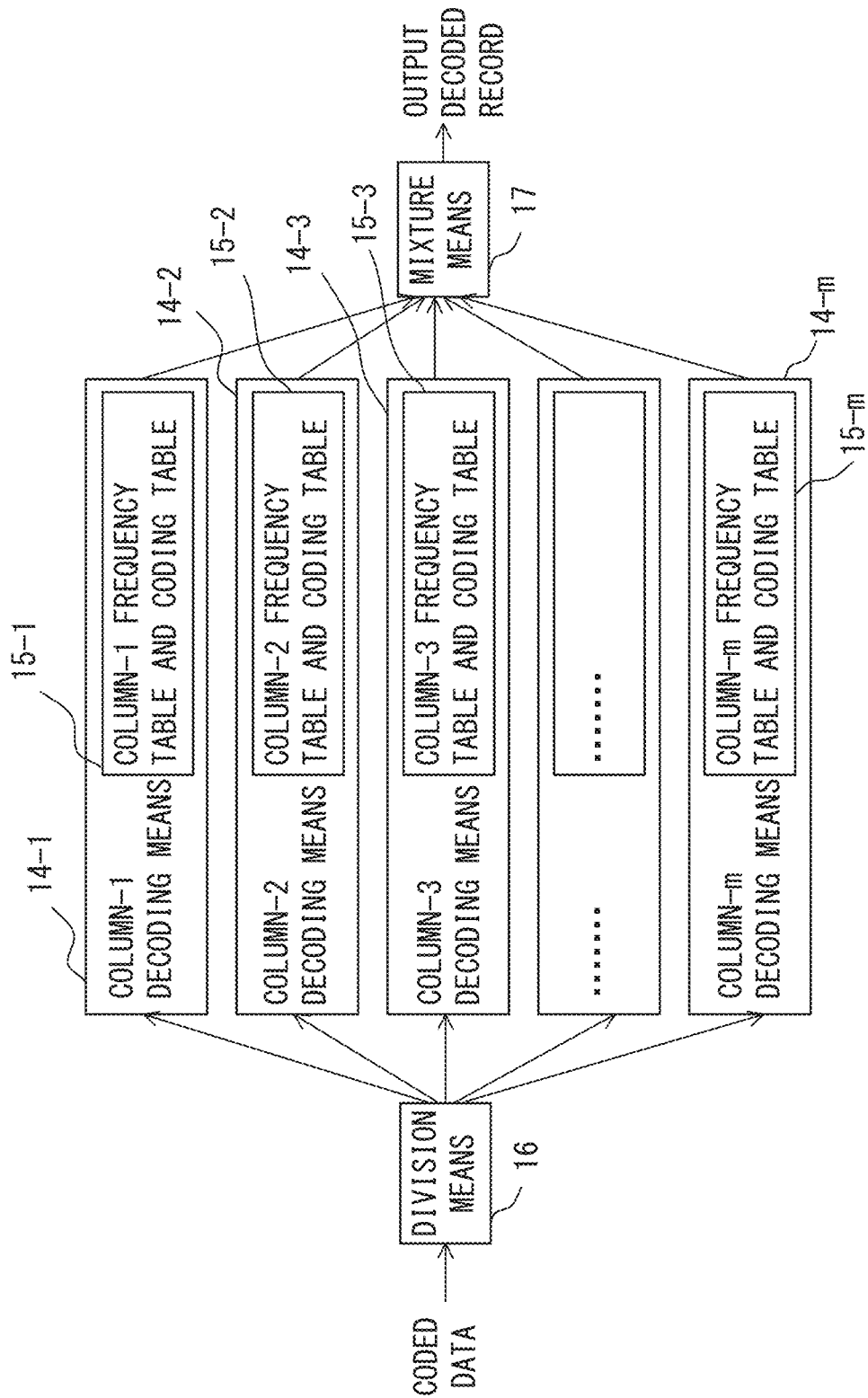

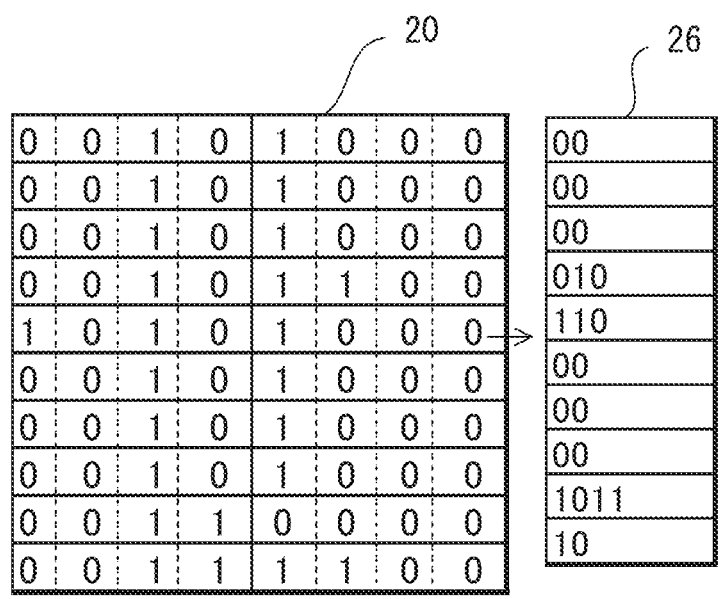
F I G. 14C

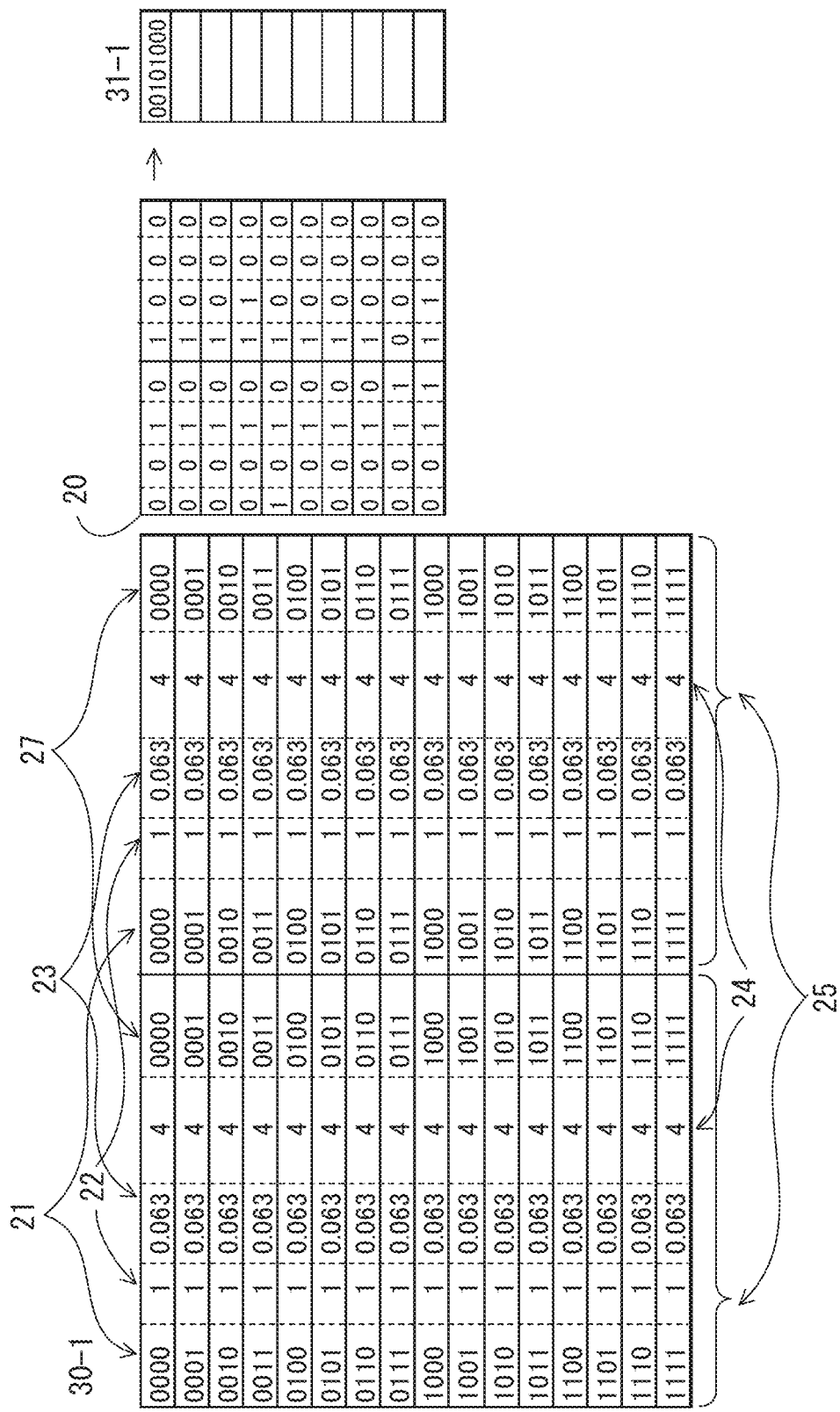

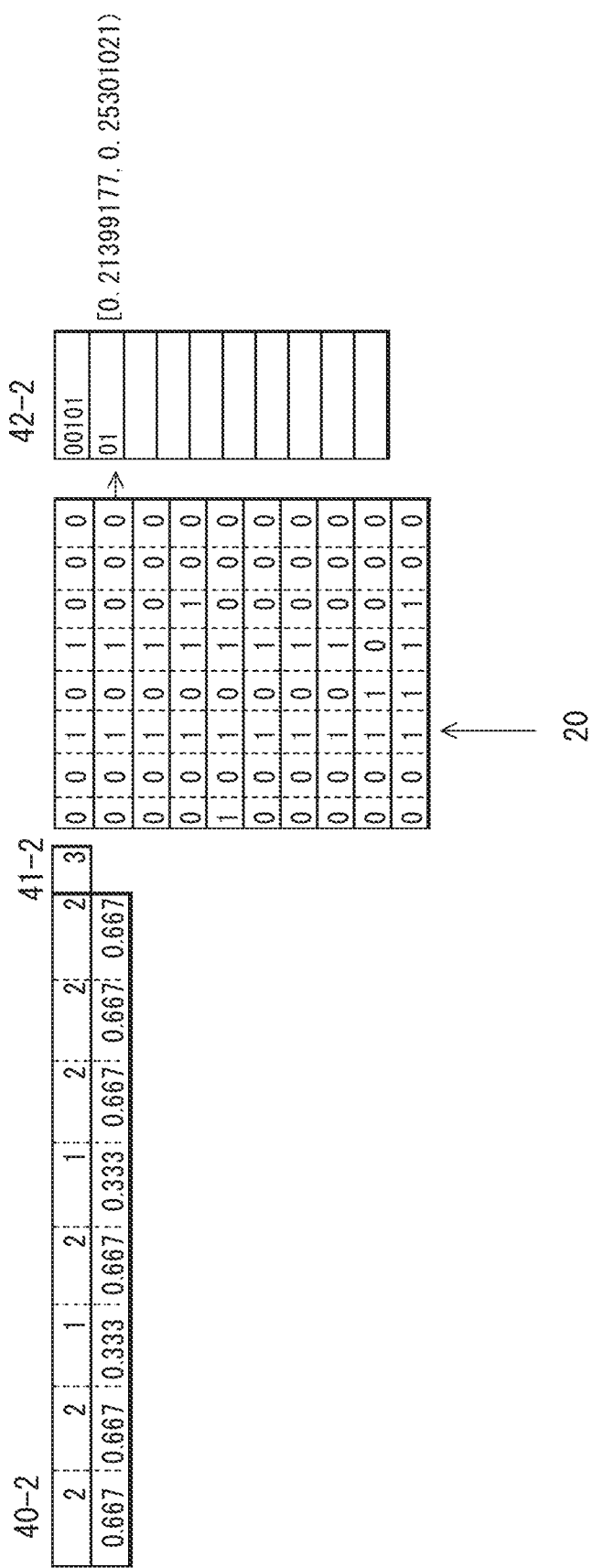

FIG. 20A (Figure showing data arrays 40-5, 41-5, matrix 20, and array 42-5 with values including 0.833, 0.167, 0.667, and binary codes 00101, 01, 01, 1, 111, resulting in [0.87255658, 0.90976747])

FIG. 20B

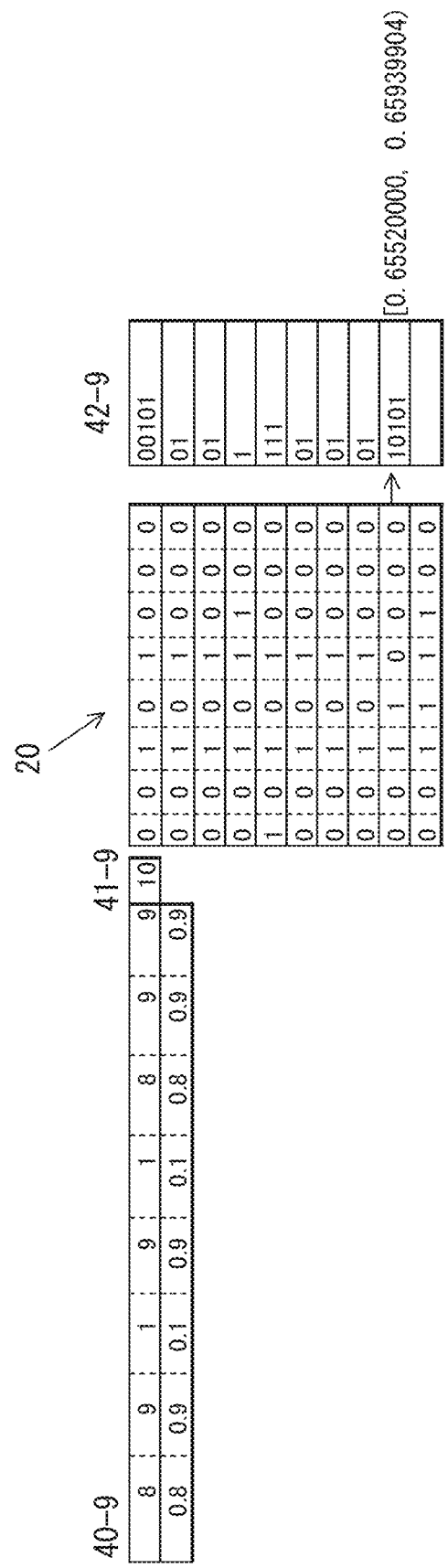

FIG. 22B 50-1

| a | b | c | d | e | a | b | c | d | e |
|---|---|---|---|---|---|---|---|---|---|
| 0000 | 0 | 0 | | | 0000 | 1 | 0.1 | 3.3219281 | 11 |
| 0001 | 0 | 0 | | | 0001 | 0 | 0 | | |
| 0010 | 7 | 0.7 | 0.514573 | 0 | 0010 | 0 | 0 | | |
| 0011 | 2 | 0.2 | 2.321928 | 10 | 0011 | 0 | 0 | | |
| 0100 | 0 | 0 | | | 0100 | 0 | 0 | | |
| 0101 | 0 | 0 | | | 0101 | 0 | 0 | | |
| 0110 | 0 | 0 | | | 0110 | 0 | 0 | | |
| 0111 | 0 | 0 | | | 0111 | 0 | 0 | | |
| 1000 | 0 | 0 | | | 1000 | 7 | 0.7 | 0.5145732 | 0 |
| 1001 | 0 | 0 | | | 1001 | 0 | 0 | | |
| 1010 | 1 | 0.1 | 3.321928 | 11 | 1010 | 0 | 0 | | |
| 1011 | 0 | 0 | | | 1011 | 0 | 0 | | |
| 1100 | 0 | 0 | | | 1100 | 2 | 0.2 | 2.3219281 | 10 |
| 1101 | 0 | 0 | | | 1101 | 0 | 0 | | |
| 1110 | 0 | 0 | | | 1110 | 0 | 0 | | |
| 1111 | 0 | 0 | | | 1111 | 0 | 0 | | |

F I G. 2 3 A 51-1          51-2

| 00 |
|----|
| 00 |
| 00 |
| 010 |
| 110 |
| 00 |
| 00 |
| 00 |
| 1011 |
| 10 |

→

| 0 | 0 | 1 | 0 | 1 | 0 | 0 | 0 |
|---|---|---|---|---|---|---|---|
| 0 | 0 | 1 | 0 | 1 | 0 | 0 | 0 |
| 0 | 0 | 1 | 0 | 1 | 0 | 0 | 0 |
| 0 | 0 | 1 | 0 | 1 | 1 | 0 | 0 |
| 1 | 0 | 1 | 0 | 1 | 0 | 0 | 0 |
| 0 | 0 | 1 | 0 | 1 | 0 | 0 | 0 |
| 0 | 0 | 1 | 0 | 1 | 0 | 0 | 0 |
| 0 | 0 | 1 | 0 | 1 | 0 | 0 | 0 |
| 0 | 0 | 1 | 1 | 0 | 0 | 0 | 0 |
| 0 | 0 | 1 | 1 | 1 | 1 | 0 | 0 |

| a | b | c | d | e |
|---|---|---|---|---|
| 0000 | 1 | 0.063 | 4 | 0000 |
| 0001 | 1 | 0.063 | 4 | 0001 |
| 0010 | 1 | 0.063 | 4 | 0010 |
| 0011 | 1 | 0.063 | 4 | 0011 |
| 0100 | 1 | 0.063 | 4 | 0100 |
| 0101 | 1 | 0.063 | 4 | 0101 |
| 0110 | 1 | 0.063 | 4 | 0110 |
| 0111 | 1 | 0.063 | 4 | 0111 |
| 1000 | 1 | 0.063 | 4 | 1000 |
| 1001 | 1 | 0.063 | 4 | 1001 |
| 1010 | 1 | 0.063 | 4 | 1010 |
| 1011 | 1 | 0.063 | 4 | 1011 |
| 1100 | 1 | 0.063 | 4 | 1100 |
| 1101 | 1 | 0.063 | 4 | 1101 |
| 1110 | 1 | 0.063 | 4 | 1110 |
| 1111 | 1 | 0.063 | 4 | 1111 |

| | | | | | | | |
|---|---|---|---|---|---|---|---|
| 0000 | 1 | 0.059 | 4.08746 | 0001 | 0000 | 1 | 0.059 | 4.0875 | 0001 |
| 0001 | 1 | 0.059 | 4.08746 | 0010 | 0001 | 1 | 0.059 | 4.0875 | 0010 |
| 0010 | 2 | 0.118 | 3.08746 | 010  | 0010 | 1 | 0.059 | 4.0875 | 0011 |
| 0011 | 1 | 0.059 | 4.08746 | 0011 | 0011 | 1 | 0.059 | 4.0875 | 0100 |
| 0100 | 1 | 0.059 | 4.08746 | 0110 | 0100 | 1 | 0.059 | 4.0875 | 0101 |
| 0101 | 1 | 0.059 | 4.08746 | 0111 | 0101 | 1 | 0.059 | 4.0875 | 0110 |
| 0110 | 1 | 0.059 | 4.08746 | 1000 | 0110 | 1 | 0.059 | 4.0875 | 0111 |
| 0111 | 1 | 0.059 | 4.08746 | 1001 | 0111 | 1 | 0.059 | 4.0875 | 1000 |
| 1000 | 1 | 0.059 | 4.08746 | 1010 | 1000 | 2 | 0.118 | 3.0875 | 101 |
| 1001 | 1 | 0.059 | 4.08746 | 1011 | 1001 | 1 | 0.059 | 4.0875 | 1001 |
| 1010 | 1 | 0.059 | 4.08746 | 1100 | 1010 | 1 | 0.059 | 4.0875 | 1100 |
| 1011 | 1 | 0.059 | 4.08746 | 1101 | 1011 | 1 | 0.059 | 4.0875 | 1101 |
| 1100 | 1 | 0.059 | 4.08746 | 1110 | 1100 | 1 | 0.059 | 4.0875 | 1110 |
| 1101 | 1 | 0.059 | 4.08746 | 1111 | 1101 | 1 | 0.059 | 4.0875 | 1111 |
| 1110 | 1 | 0.059 | 4.08746 | 00000 | 1110 | 1 | 0.059 | 4.0875 | 00000 |
| 1111 | 1 | 0.059 | 4.08746 | 00001 | 1111 | 1 | 0.059 | 4.0875 | 00001 |

| 00101000 | | | | | | | | | 0 | 0 | 1 | 0 | 1 | 0 | 0 | 0 |
| 010101 | | | | | | | | → | 0 | 1 | 0 | 1 | 0 | 1 | 0 | 0 |

FIG. 25A

| 50-4 | | | | | | |
|---|---|---|---|---|---|---|
| 0000 | 1 | 0.056 | 4.16993 | 0001 | 0000 | 1 | 0.059 | 4.08746 | 0001 |
| 0001 | 1 | 0.056 | 4.16993 | 0100 | 0001 | 1 | 0.059 | 4.08746 | 0100 |
| 0010 | 3 | 0.167 | 2.58496 | 001 | 0010 | 1 | 0.059 | 4.08746 | 0101 |
| 0011 | 1 | 0.056 | 4.16993 | 0101 | 0011 | 1 | 0.059 | 4.08746 | 0110 |
| 0100 | 1 | 0.056 | 4.16993 | 0110 | 0100 | 1 | 0.059 | 4.08746 | 0111 |
| 0101 | 1 | 0.056 | 4.16993 | 0111 | 0101 | 1 | 0.059 | 4.08746 | 1000 |
| 0110 | 1 | 0.056 | 4.16993 | 1000 | 0110 | 1 | 0.059 | 4.08746 | 1001 |
| 0111 | 1 | 0.056 | 4.16993 | 1001 | 0111 | 1 | 0.059 | 4.08746 | 1010 |
| 1000 | 1 | 0.056 | 4.16993 | 1010 | 1000 | 3 | 0.176 | 2.5025 | 001 |
| 1001 | 1 | 0.056 | 4.16993 | 1011 | 1001 | 1 | 0.059 | 4.08746 | 1011 |
| 1010 | 1 | 0.056 | 4.16993 | 1100 | 1010 | 1 | 0.059 | 4.08746 | 1100 |
| 1011 | 1 | 0.056 | 4.16993 | 1101 | 1011 | 1 | 0.059 | 4.08746 | 1101 |
| 1100 | 1 | 0.056 | 4.16993 | 1110 | 1100 | 1 | 0.059 | 4.08746 | 1110 |
| 1101 | 1 | 0.056 | 4.16993 | 1111 | 1101 | 1 | 0.059 | 4.08746 | 1111 |
| 1110 | 1 | 0.056 | 4.16993 | 00000 | 1110 | 1 | 0.059 | 4.08746 | 00000 |
| 1111 | 1 | 0.056 | 4.16993 | 00001 | 1111 | 1 | 0.059 | 4.08746 | 00001 |

| 0010100 | | | | | | | 0 | 0 | 1 | 0 | 0 | 0 | 0 |
| 010101 | | | | | | | 0 | 0 | 0 | 1 | 0 | 1 | 0 |
| 001001 | → | | | | | | 0 | 0 | 1 | 0 | 0 | 1 | 0 |

F I G. 2 5 B 50-5

| | | | | | | | |
|---|---|---|---|---|---|---|---|
| 0000 | 1 | 0.053 | 4.24793:0001 | 0000 | 1 | 0.053 | 4.24793:0011 |
| 0001 | 1 | 0.053 | 4.24793:0100 | 0001 | 1 | 0.053 | 4.24793:0100 |
| 0010 | 4 | 0.211 | 2.24793:001 | 0010 | 1 | 0.053 | 4.24793:0101 |
| 0011 | 1 | 0.053 | 4.24793:0101 | 0011 | 1 | 0.053 | 4.24793:0110 |
| 0100 | 1 | 0.053 | 4.24793:0110 | 0100 | 1 | 0.053 | 4.24793:0111 |
| 0101 | 1 | 0.053 | 4.24793:0111 | 0101 | 1 | 0.053 | 4.24793:1000 |
| 0110 | 1 | 0.053 | 4.24793:1000 | 0110 | 1 | 0.053 | 4.24793:1001 |
| 0111 | 1 | 0.053 | 4.24793:1001 | 0111 | 1 | 0.053 | 4.24793:1010 |
| 1000 | 1 | 0.053 | 4.24793:1010 | 1000 | 4 | 0.211 | 2.24793:11 |
| 1001 | 1 | 0.053 | 4.24793:1011 | 1001 | 1 | 0.053 | 4.24793:1011 |
| 1010 | 1 | 0.053 | 4.24793:1100 | 1010 | 1 | 0.053 | 4.24793:00000 |
| 1011 | 1 | 0.053 | 4.24793:1101 | 1011 | 1 | 0.053 | 4.24793:00001 |
| 1100 | 1 | 0.053 | 4.24793:1110 | 1100 | 1 | 0.053 | 4.24793:00010 |
| 1101 | 1 | 0.053 | 4.24793:1111 | 1101 | 1 | 0.053 | 4.24793:00011 |
| 1110 | 1 | 0.053 | 4.24793:00000 | 1110 | 1 | 0.053 | 4.24793:00100 |
| 1111 | 1 | 0.053 | 4.24793:00001 | 1111 | 1 | 0.053 | 4.24793:00101 |

| | | | |
|---|---|---|---|
| 00101000 | 0 | 0 | 1 | 0 | 0 |
| 010101 | 0 | 0 | 1 | 0 | 0 |
| 001001 | 0 | 0 | 1 | 0 | 0 |
| 00100010 | 0 | 0 | 1 | 1 | 0 |

FIG. 26A 50-6

| 0000 | 1 | 0.05 | 4.32193 | 0011 | 0000 | 1 | 0.05 | 4.32193 | 0100 |
|---|---|---|---|---|---|---|---|---|---|
| 0001 | 1 | 0.05 | 4.32193 | 1000 | 0001 | 1 | 0.05 | 4.32193 | 0101 |
| 0010 | 5 | 0.25 | 2 | 01 | 0010 | 1 | 0.05 | 4.32193 | 0110 |
| 0011 | 1 | 0.05 | 4.32193 | 1001 | 0011 | 1 | 0.05 | 4.32193 | 0111 |
| 0100 | 1 | 0.05 | 4.32193 | 1010 | 0100 | 1 | 0.05 | 4.32193 | 1000 |
| 0101 | 1 | 0.05 | 4.32193 | 1011 | 0101 | 1 | 0.05 | 4.32193 | 1001 |
| 0110 | 1 | 0.05 | 4.32193 | 1100 | 0110 | 1 | 0.05 | 4.32193 | 1010 |
| 0111 | 1 | 0.05 | 4.32193 | 1101 | 0111 | 1 | 0.05 | 4.32193 | 1011 |
| 1000 | 1 | 0.05 | 4.32193 | 1110 | 1000 | 4 | 0.2 | 2.32193 | 11 |
| 1001 | 1 | 0.05 | 4.32193 | 1111 | 1001 | 1 | 0.05 | 4.32193 | 00000 |
| 1010 | 1 | 0.05 | 4.32193 | 00000 | 1010 | 1 | 0.05 | 4.32193 | 00001 |
| 1011 | 1 | 0.05 | 4.32193 | 00001 | 1011 | 1 | 0.05 | 4.32193 | 00010 |
| 1100 | 1 | 0.05 | 4.32193 | 00010 | 1100 | 2 | 0.1 | 3.32193 | 0010 |
| 1101 | 1 | 0.05 | 4.32193 | 00011 | 1101 | 1 | 0.05 | 4.32193 | 00011 |
| 1110 | 1 | 0.05 | 4.32193 | 00100 | 1110 | 1 | 0.05 | 4.32193 | 00110 |
| 1111 | 1 | 0.05 | 4.32193 | 00101 | 1111 | 1 | 0.05 | 4.32193 | 00111 |

| 00101000 | 0 | 1 | 0 | 1 | 0 | 0 | 0 |
|---|---|---|---|---|---|---|---|
| 010101 | 0 | 1 | 0 | 1 | 0 | 1 |  |
| 001001 | 0 | 1 | 0 | 1 | 0 | 0 |  |
| 00100010 | 0 | 1 | 0 | 1 | 0 | 0 | 1 | 0 |
| 0000011 | 1 | 1 | 1 | 1 | 1 | 1 | 0 |

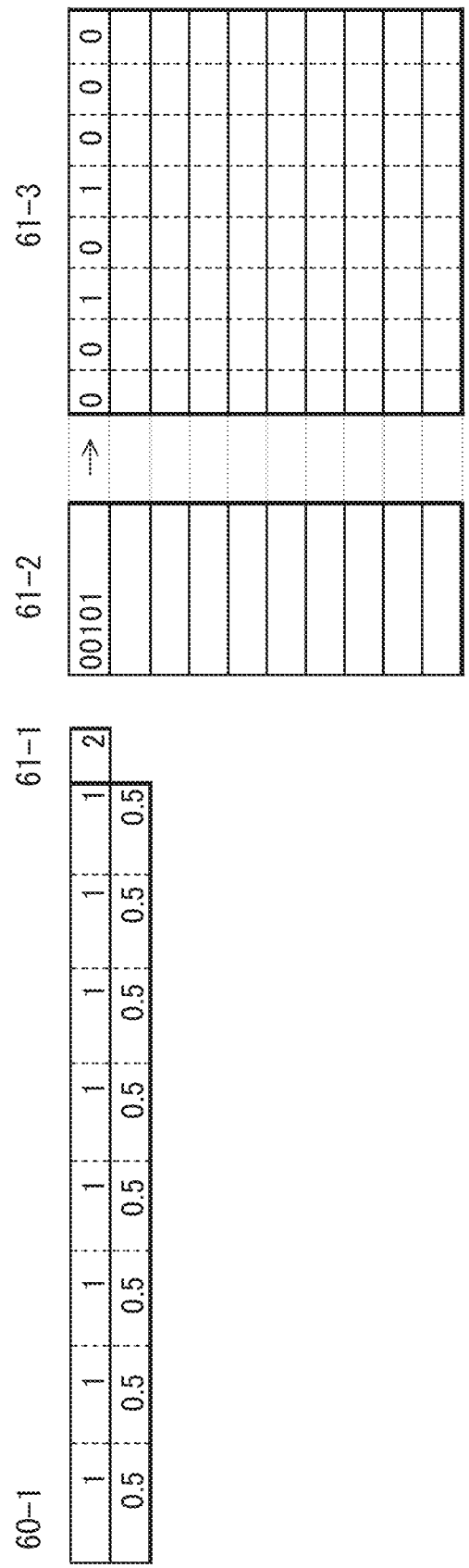

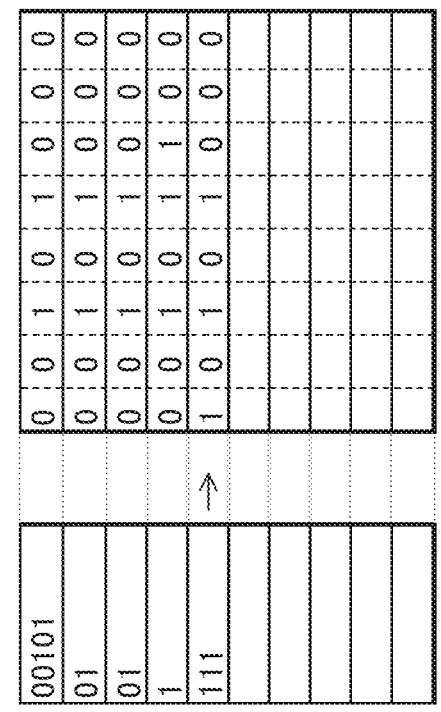

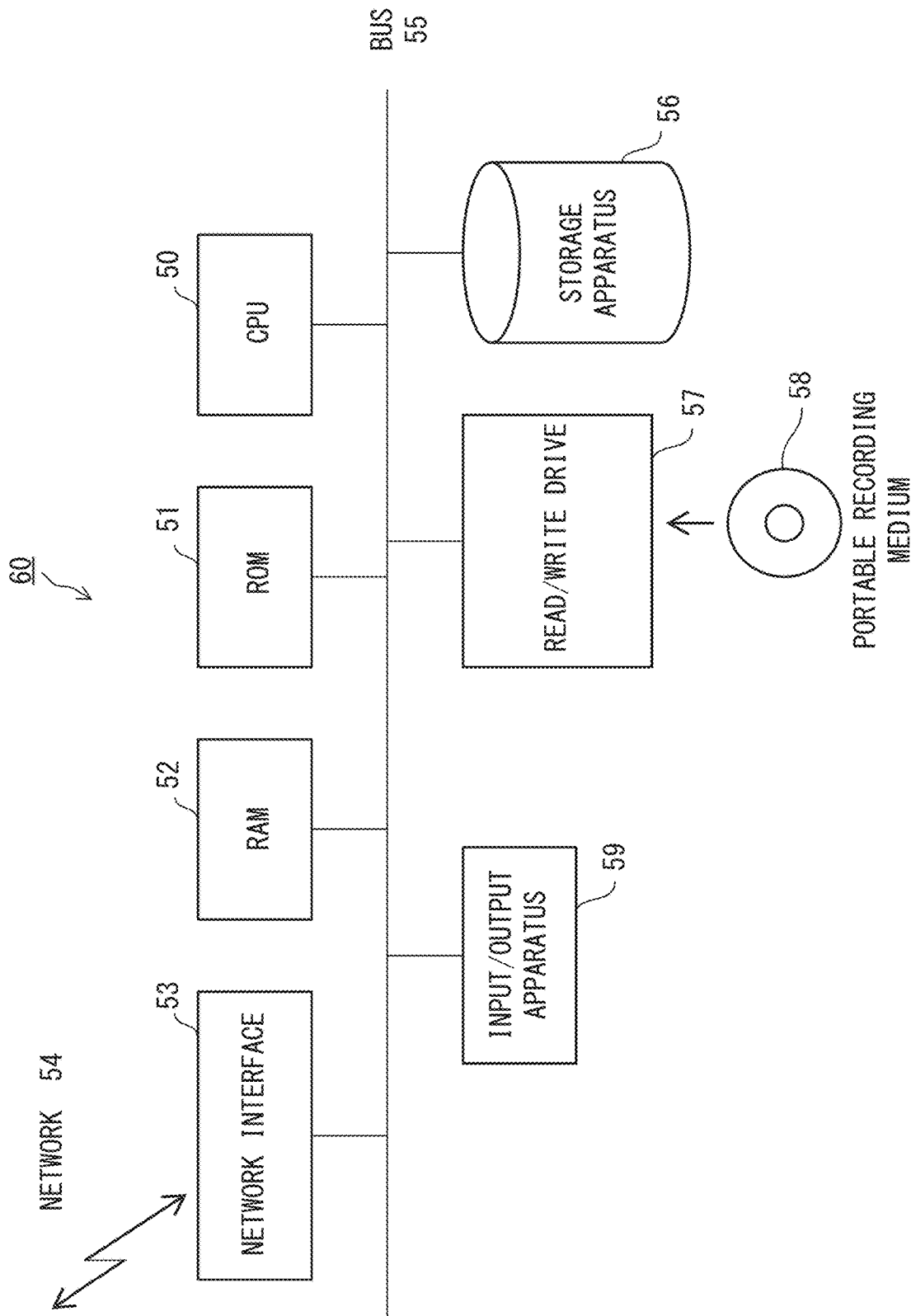

DATA COMPRESSION CODING METHOD, APPARATUS THEREFOR, AND PROGRAM THEREFOR

CROSS REFERENCE TO RELATED APPLICATIONS

This application is a continuation of PCT/JP2017/025955, filed on Jul. 18, 2017. PCT/JP2017/025955 is based on and claims the benefit of priority of the prior Japanese patent application 2016-145397 filed on Jul. 25, 2016, the entire contents of which are incorporated by reference. The contents of PCT/JP2017/025955 are incorporated by reference.

BACKGROUND OF THE INVENTION

Field of the Invention

The embodiments described in the following relate to a data compression coding method, an apparatus therefor, and a program therefor.

Description of Related Art

In recent years, sensor networks have planned to be built in which a plurality of radio terminals with sensors are scattered throughout a space and operated in cooperation with each other to collect environmental or physical situations. With the development of electronic control of automobiles, various in-vehicle sensor networks have been put into practical use.

FIG. 1 is a schematic view schematically illustrating the sensor networks. For example, in a sensor network 1, data detected by a sensor 2a or the like may be transmitted to a processing apparatus 4 via a sensor node 5 and a gateway 3. In transmitting data obtained by sensor 2a, 2b, or 2c to the processing apparatus 4, the transmitted data tends to have a fixed length in data size. In the example of FIG. 1, a data compression apparatus is provided at a sensor node.

A data string in which pieces of data with a size determined in advance are arranged in a certain order, such as environmental conditions detected by sensors, is referred to as a record. In such a situation, one record is fixed length data that includes a bit string with a fixed length. In a sensor network, sensors continuously output, as records, data such as environmental conditions detected by the sensors moment by moment. The sensors include a temperature sensor, a humidity sensor, a pressure sensor, a rotational velocity sensor, a wind velocity sensor, a flow velocity sensor, an acceleration sensor, a velocity sensor, a position sensor, and a sensor for detecting ON/OFF information of a switch.

FIGS. 2A-2C illustrate an example of the fixed length data described above.

In the example depicted in FIGS. 2A-2C, a rotation pulse number is indicated as detection information of sensor 2a, and ON/OFF information of corresponding switches is indicated as detection information of sensors 2b and 2c.

The bit length of fixed length data transmitted or received in the sensor network 1 is set to a fixed value. For every predetermined number of bits, the fixed-length bit data may be divided into fields for each of which a type of data to be contained is determined. Table 201 of FIG. 2A indicates an example of fixed length data in decimal notation. In the example of table 201, time expressed in 26 bits is contained in the leading field of fixed length data, and a 14-bit rotation pulse number, which is an output of a rotation-pulse-number sensor 2a, is contained in the following field. Next, 1-bit data indicating that detection information of sensor 2b is ON or OFF is contained, and then 1-bit data indicating that detection information of sensor 2c is ON or OFF is contained. The data bit length of the entirety of the data is a fixed value. The examples of FIGS. 1 and 2 indicate that one sensor node 5 in the sensor network 1 is provided with three sensors. However, the type and number of sensors provided for one sensor node are not limited to these, and one or more any type of sensors may be provided.

Table 202 of FIG. 2B indicates, in binary notation, the fixed length data indicated in decimal notation in table 201. Also in this situation, a 26-bit time, a 14-bit rotation pulse number, 1-bit data indicating that sensor 1 is ON or OFF state, and 1-bit data indicating that sensor 2 is ON or OFF state are contained in this order. Table 203 of FIG. 2C indicates, as continuous bits, the fixed length data indicated in binary notation in table 202. Also in this case, since it is determined in advance which set of continuous bits after the leading bit indicates what information, an apparatus that has received the fixed length data can cognize data contained in the fixed length data by sequentially reading the bits starting from the leading bit.

In the examples of FIG. 1 and FIGS. 2A-2C, a rotation pulse number and ON/OFF information of a switch are indicated as detection information of sensors. However, the sensor of the present embodiment is not limited to this and may detect various detectable amounts, e.g., temperature, humidity, position, velocity, acceleration, wind velocity, flow velocity, pressure, etc.

In addition, transmitted or received data does not need to be limited to detection information of the sensor. The present invention is applicable not only to detection information of a sensor but also to data sequentially transmitted from a transmission source.

In continuously transferring such records with a fixed length, a method may be used wherein a certain amount of data is accumulated and transferred after the data size is decreased using an existing compression technique, and a receiver decompresses the data.

In this case, a desirable compression efficiency would not be achieved without a relatively large amount of accumulation, and if the compression efficiency is prioritized, a delay will occur due to an accumulating time. Hence, when immediacy is required, data may be sent without being compressed. However, transferring data without compression will lead to a larger amount data transfer than in a situation in which the data is compressed.

Conventional techniques for data compression include those disclosed in patent documents 1-8 and non-patent document 1, but none of these documents describe a data compression coding method suitable for coding fixed length data.

Patent document 1: Japanese Laid-open Patent Publication No. 2007-214998
Patent document 2: U.S. Patent Publication No. 2011/0200104
Patent document 3: Japanese National Publication of International Patent Application No. 2014-502827
Patent document 4: Japanese Laid-open Patent Publication No. 2010-26884
Patent document 5: Japanese Laid-open Patent Publication No. 2007-214813
Patent document 6: International Publication Pamphlet No. WO 2013175909
Patent document 7: Japanese Laid-open Patent Publication No. 2007-221280

Patent document 8: Japanese Laid-open Patent Publication No. 2011-48514

Non-patent document 1: lossless compression handbook, academic press, 2002/8/15, ISBN-10: 0126208611, ISBN-13: 978-0126208610

SUMMARY OF THE INVENTION

Accordingly, an object of an embodiment in accordance with an aspect of the present invention is to provide a data compression coding method suitable for coding fixed length data, an apparatus therefor, and a program therefor.

Data compression coding in accordance with an aspect of the invention includes: dividing, into columns each with a predetermined bit width, records consisting of a fixed-length bit string that includes one or more fields, pieces of data of the same type being contained in the same field among fields determined in advance, the dividing being performed independently of boundaries between the fields; and determining, for each column, a probability of occurrence of a bit value in the column at the same position among a plurality of records, and entropy-coding the plurality of records on the basis of the probability of occurrence.

Data compression coding in accordance with another aspect of the invention is sensor-data compression coding in which pieces of sensor data input from one or more sensors are coupled as a record consisting of a fixed-length bit string, and the record is compression-coded and output, wherein the record is divided into columns each with a predetermined bit width, the probability of occurrence of a bit value in a column at the same position is determined for each column among a plurality of records that have been input by that moment, each column forming the record is coded via entropy coding on the basis of the probability of occurrence, and the process of coupling and outputting the coded columns is repeated for a predetermined number of records.

Accordingly, a fixed-length bit string formed by coupling a predetermined number of pieces of sensor data sequentially input in series from one or more sensors is defined as virtual tabular data, and the virtual tabular data is compressed in a column direction.

The entropy coding refers to a coding scheme in which compression is performed by assigning a short code length to symbols with a high probability of occurrence and by assigning a long code length to symbols with a low probability of occurrence. Huffman codes and arithmetic codes are known as representative codes used for the entropy coding. Huffman codes have many schemes such as adaptive Huffman codes and Canonical Huffman Codes, etc. And many schemes such as adaptive arithmetic codes, Q coders, range coders, or the like are known regarding arithmetic codes.

An embodiment in accordance with an aspect of the present invention is capable of providing a data compression coding method suitable for coding fixed length data, an apparatus therefor, and a program therefor.

BRIEF DESCRIPTION OF THE DRAWINGS

FIG. 1 is a schematic view schematically illustrating a sensor network;

FIGS. 2A-2C illustrate an example of fixed length data;

FIG. 3 illustrates column division in accordance with a coding method of the present embodiment;

FIG. 4A illustrates an exemplary functional block configuration of a data compression coding apparatus in accordance with the embodiment;

FIG. 4B illustrates another exemplary functional block configuration of a data compression coding apparatus in accordance with the embodiment;

FIG. 5A illustrates an exemplary functional block configuration of a decoding apparatus that corresponds to the data compression coding apparatus depicted in FIG. 4A;

FIG. 14A illustrates a record group for describing an accumulative Huffman coding method of the embodiment on the basis of a specific example;

FIG. 14B illustrates a code dictionary for describing an accumulative Huffman coding method of the embodiment on the basis of a specific example;

FIG. 14C illustrates coded data according to an accumulative Huffman coding method of the embodiment on the basis of a specific example;

FIG. 15A illustrates an adaptive Huffman coding method of the embodiment on the basis of a specific example (stage 1);

FIG. 16A illustrates an adaptive Huffman coding method of the embodiment on the basis of a specific example (stage 3);

FIG. 17A illustrates an adaptive Huffman coding method of the embodiment on the basis of a specific example (stage 5);

FIG. 17B illustrates an adaptive Huffman coding method of the embodiment on the basis of a specific example (stage 6);

FIG. 18A illustrates, on the basis of a specific example, a data compression coding method of the embodiment with column division performed on a bit-by-bit basis (stage 1);

FIG. 18B illustrates, on the basis of a specific example, a data compression coding method of the embodiment with column division performed on a bit-by-bit basis (stage 2);

FIG. 19A illustrates, on the basis of a specific example, a data compression coding method of the embodiment with column division performed on a bit-by-bit basis (stage 3);

FIG. 19B illustrates, on the basis of a specific example, a data compression coding method of the embodiment with column division performed on a bit-by-bit basis (stage 4);

FIG. 20A illustrates, on the basis of a specific example, a data compression coding method of the embodiment with column division performed on a bit-by-bit basis (stage 5);

FIG. 20B illustrates, on the basis of a specific example, a data compression coding method of the embodiment with column division performed on a bit-by-bit basis (stage 6);

FIG. 22A illustrates, on the basis of a specific example, a data compression coding method of the embodiment with column division performed on a bit-by-bit basis (stage 9);

FIG. 22B illustrates, on the basis of a specific example, a data compression coding method of the embodiment with column division performed on a bit-by-bit basis (stage 10);

FIG. 23A illustrates, on the basis of a specific example, preparation of a code dictionary in a decoding method of coded data that has been coded by an accumulative Huffman coding method of the embodiment;

FIG. 23B illustrates, on the basis of a specific example, decoding of coded data that has been coded by an accumulative Huffman coding method of the embodiment;

FIG. 24A illustrates, on the basis of a specific example, a decoding method of coded data that has been coded by an adaptive Huffman coding method of the embodiment (stage 1);

FIG. 24B illustrates, on the basis of a specific example, a decoding method of coded data that has been coded by an adaptive Huffman coding method of the embodiment (stage 2);

FIG. 25A illustrates, on the basis of a specific example, a decoding method of coded data that has been coded by an adaptive Huffman coding method of the embodiment (stage 3);

FIG. 25B illustrates, on the basis of a specific example, a decoding method of coded data that has been coded by an adaptive Huffman coding method of the embodiment (stage 4);

Figure 26B:
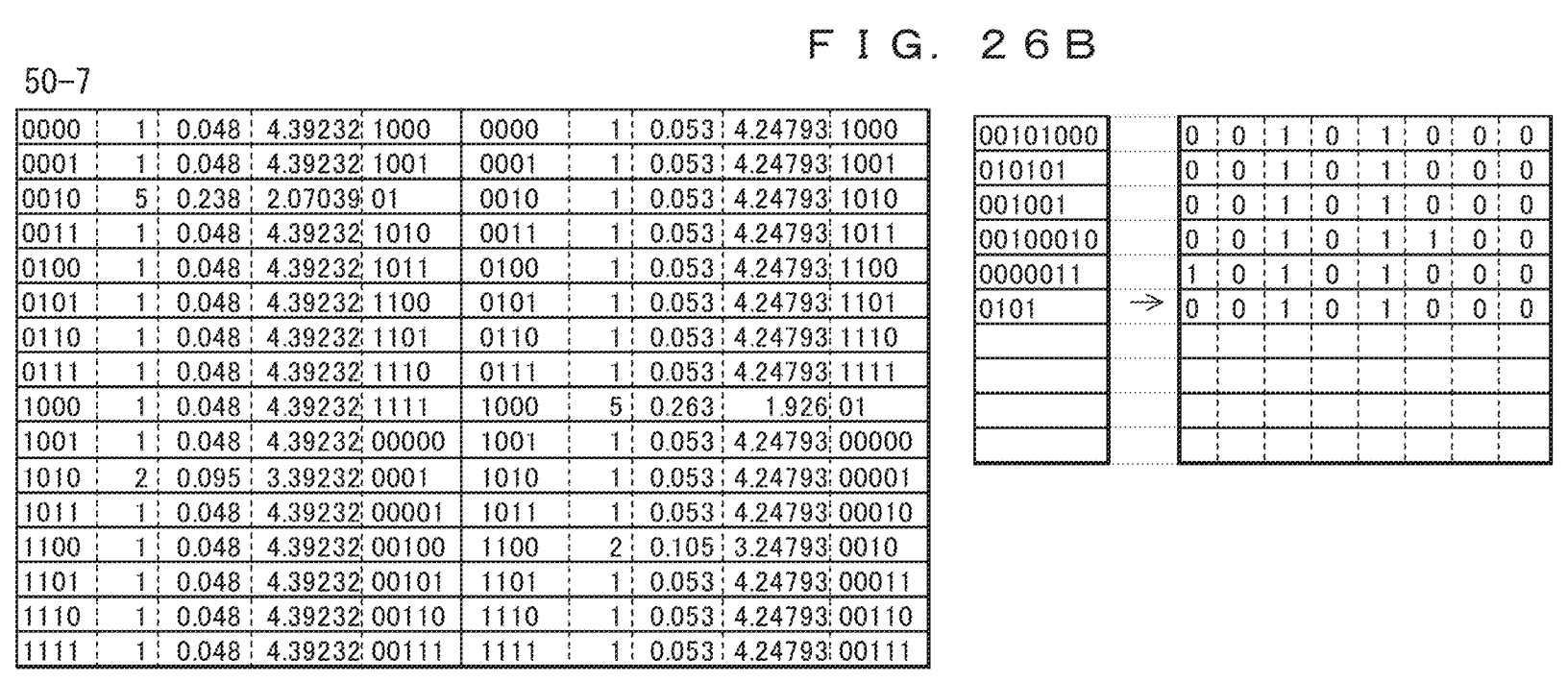

FIG. 26A illustrates, on the basis of a specific example, a decoding method of coded data that has been coded by an adaptive Huffman coding method of the embodiment (stage 5);

FIG. 26B illustrates, on the basis of a specific example, a decoding method of coded data that has been coded by an adaptive Huffman coding method of the embodiment (stage 6);

FIG. 27A illustrates, on the basis of a specific example, a decoding method of coded data that has been coded by an adaptive arithmetic coding method of the embodiment (stage 1);

Figure 28A:
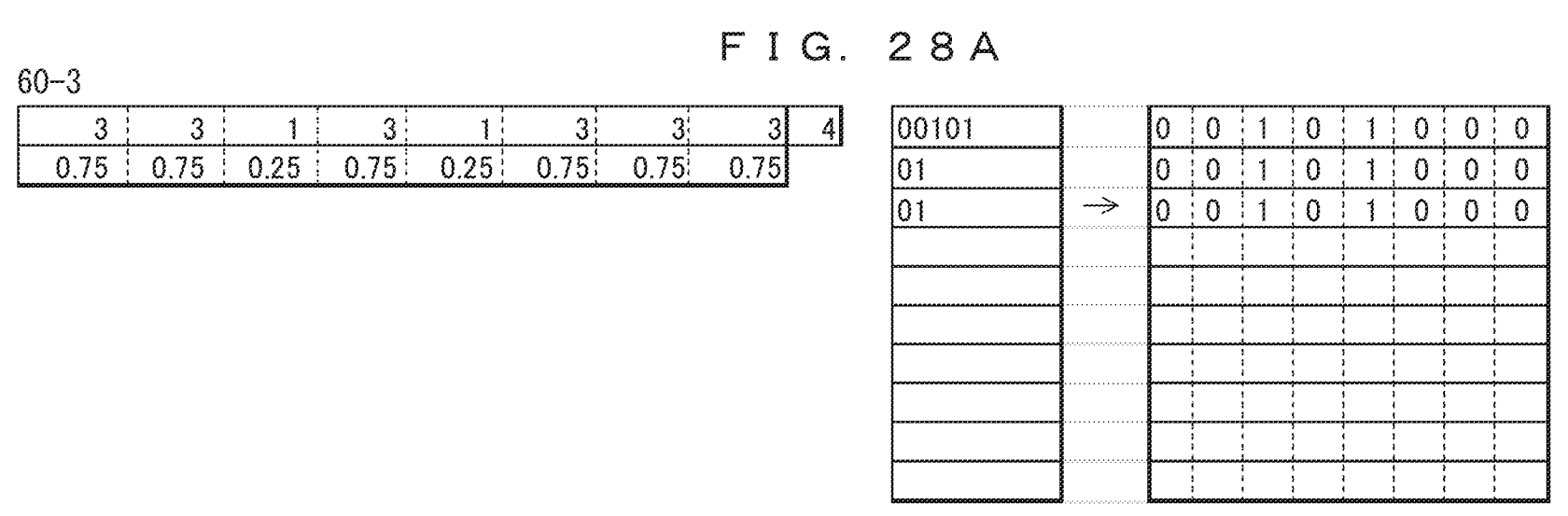
Figure 28B:
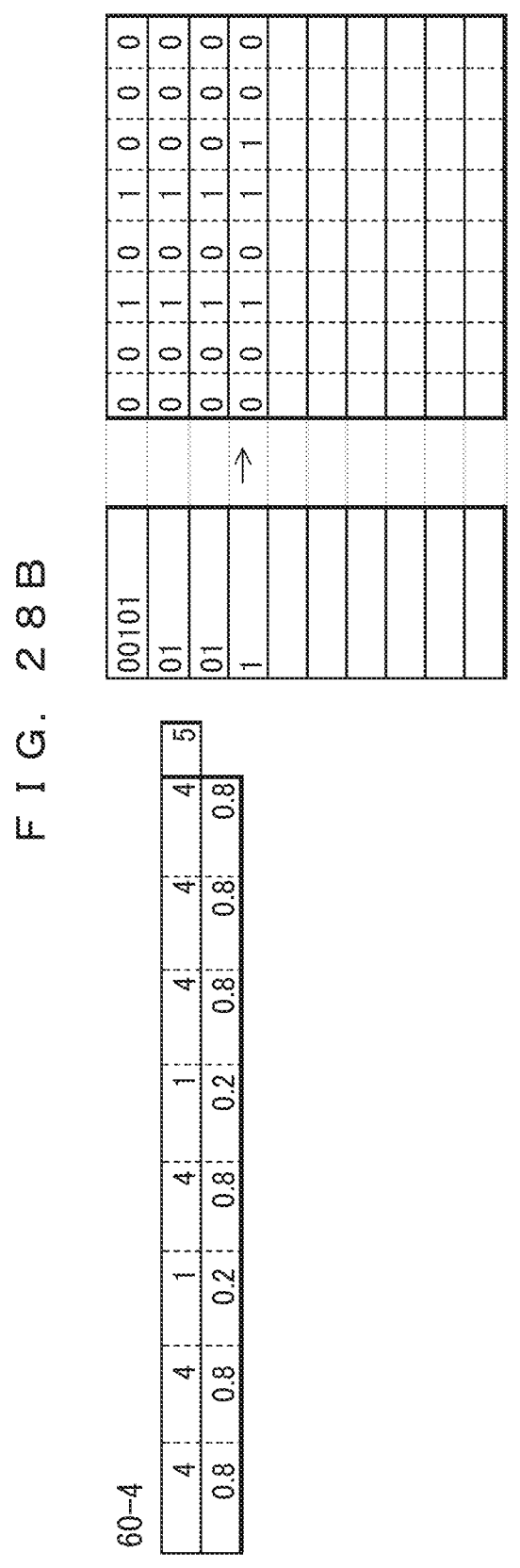

FIG. 28A illustrates, on the basis of a specific example, a decoding method of coded data that has been coded by an adaptive arithmetic coding method of the embodiment (stage 3);

FIG. 28B illustrates, on the basis of a specific example, a decoding method of coded data that has been coded by an adaptive arithmetic coding method of the embodiment (stage 4);

Figure 29B:
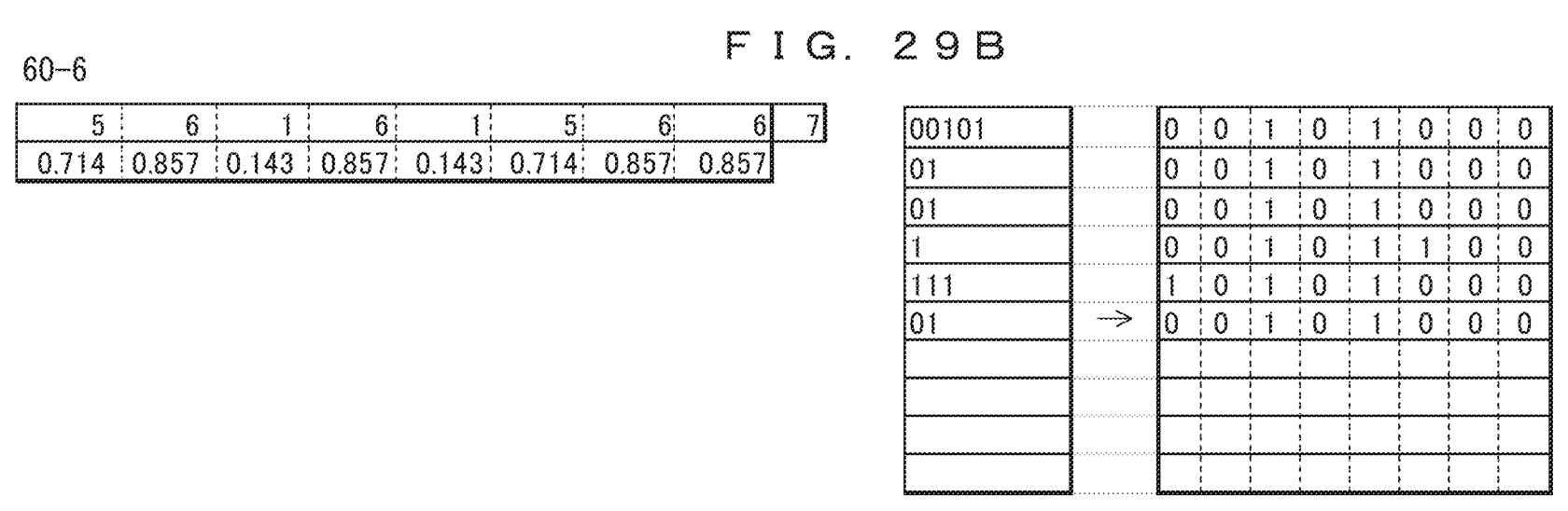

FIG. 29A illustrates, on the basis of a specific example, a decoding method of coded data that has been coded by an adaptive arithmetic coding method of the embodiment (stage 5);

FIG. 29B illustrates, on the basis of a specific example, a decoding method of coded data that has been coded by an adaptive arithmetic coding method of the embodiment (stage 6);

Figure 30A:
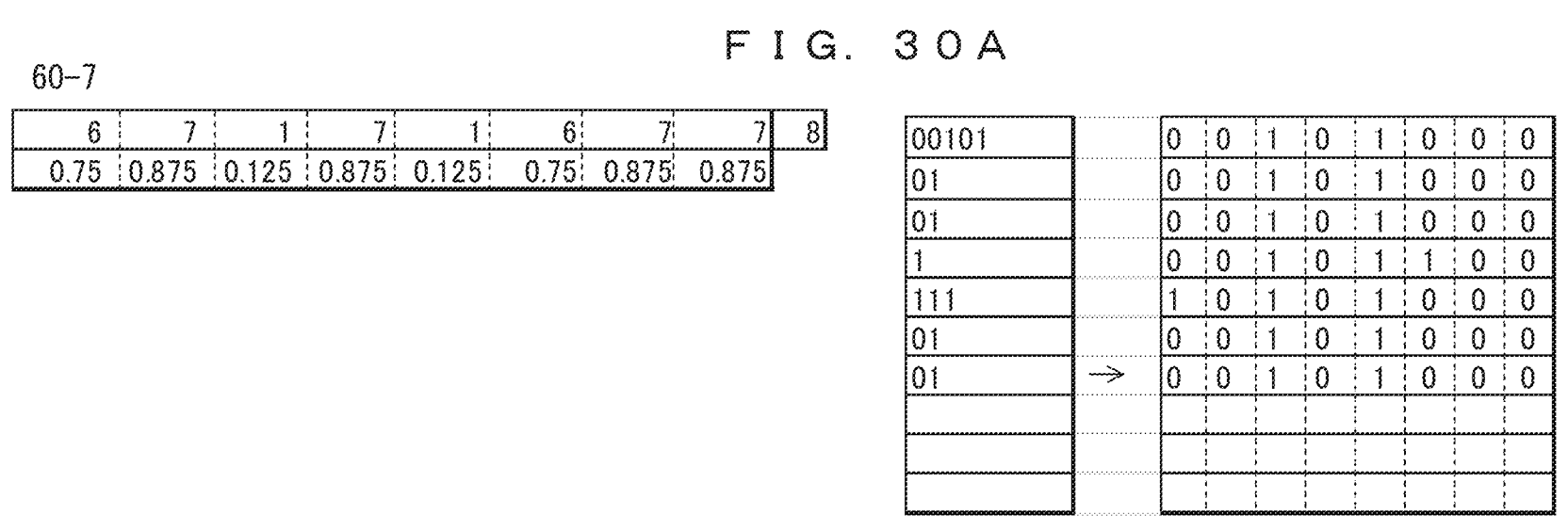
Figure 30B:
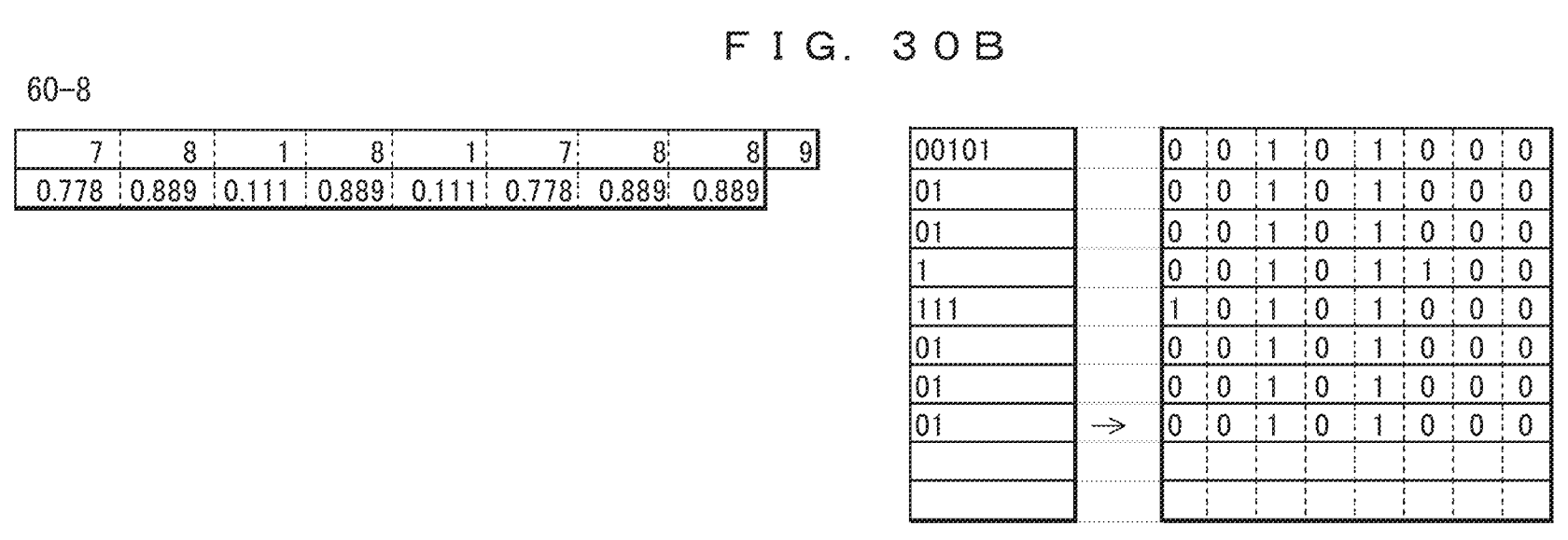

FIG. 30A illustrates, on the basis of a specific example, a decoding method of coded data that has been coded by an adaptive arithmetic coding method of the embodiment (stage 7);

FIG. 30B illustrates, on the basis of a specific example, a decoding method of coded data that has been coded by an adaptive arithmetic coding method of the embodiment (stage 8);

FIG. 31B illustrates, on the basis of a specific example, a decoding method of coded data that has been coded by an adaptive arithmetic coding method of the embodiment (stage 10); and FIG. 32 is a hardware environment diagram of an exemplary computer for executing a program in implementing the embodiment by using the program.

DESCRIPTION OF EMBODIMENTS

Figure 5B:
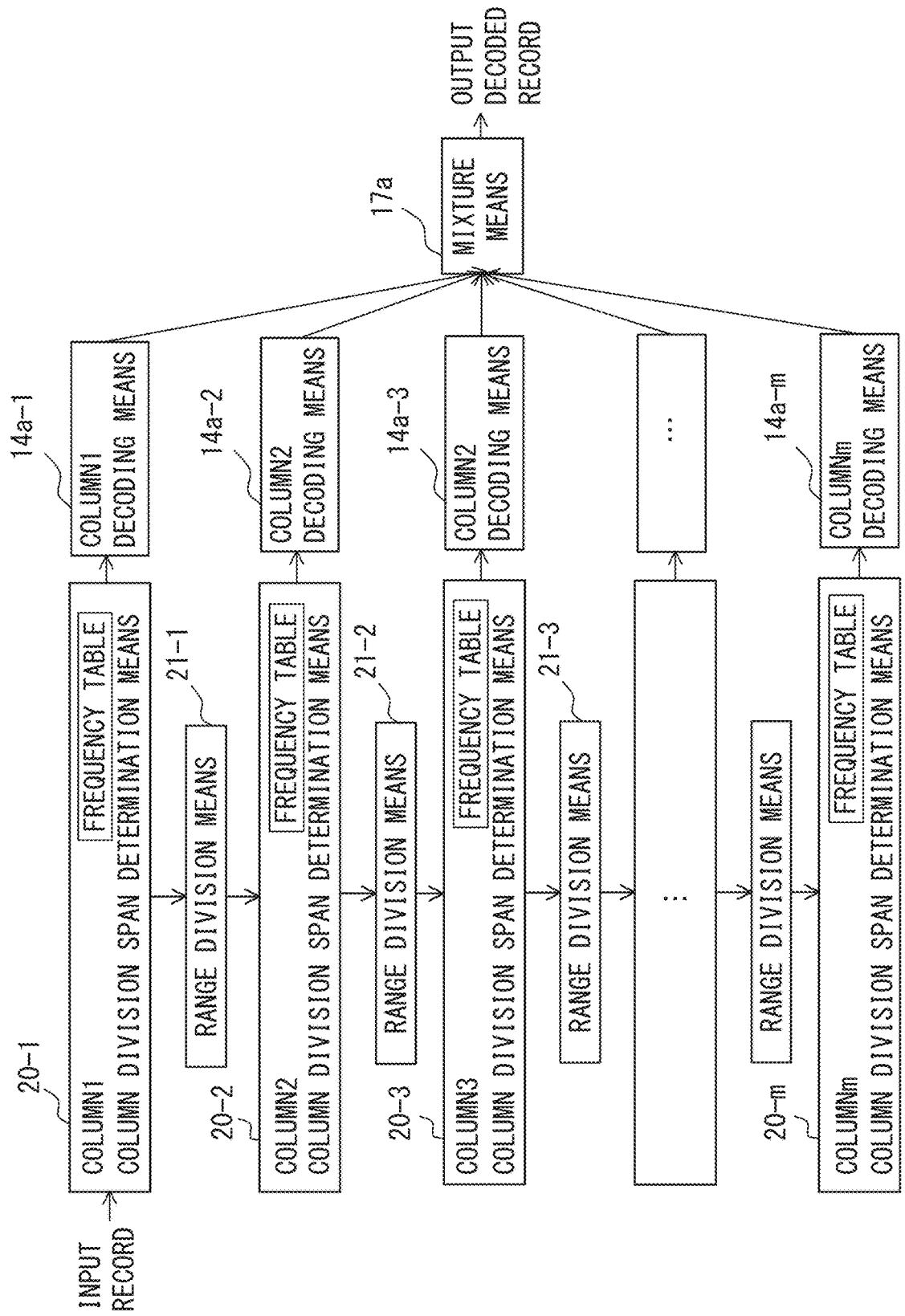
FIG. 5B illustrates an exemplary functional block configuration of a decoding apparatus that corresponds to the data compression coding apparatus depicted in FIG. 4B.

FIG. 3 illustrates column division in accordance with the present embodiment.

FIG. 3 depicts an example of one record of fixed length data consisting of a fixed-length bit string. The record consists of fields with determined bit positions and widths, and data is contained in fields 1 to n. In the embodiment, the record is divided into columns each with a predetermined bit width. In the case of FIG. 3, for example, column 1 may consist of bits 1 to a1, column 2 may consist of bits a1+1 to a2, column 3 may consist of bits a2+1 to a3, ... column may consist of bits am−1+1 to am. a1 to am may be the same value or may be different values. The columns may be divided in conformity with the positions and widths of fields or may be divided independently of the widths and positions of the fields. A column may have a bit width of, for example, one bit, two bits, four bits, eight bits, or sixteen bits, etc.

Even if significant data is formed as variable-length data and fixed length data is achieved by adding "0" to the rear of the significant data so as to adjust the data length, the data is included in fixed length data; the method of the present embodiment is also applicable in a situation in which variable-length data consists of fields for storing the same type of data and in which the data length is set to a fixed value by burying "0" when data is not recorded at rear data. As described above, in the embodiment, a record consisting of a fixed-length bit string of fixed length data includes data having different meanings contained in a plurality of determined fields, and each record has the same type of data contained in a field at the same position. In addition, a record is divided into columns, i.e., blocks with an arbitrary number of bits, each of columns is individually coded in a continuous manner in a column direction so as to achieve compression coding that is more effective than the conventional coding method. Accordingly, in the embodiment, one record is coded by coding columns continuously for each column located at the same position in a plurality of records.

Here, coding individually for each column means that the coding process does not depend on pieces of data in different columns. A field refers to a data storage location in fixed length data at which a piece of data is contained, wherein for each individual field, the meaning of a piece of data contained in the field is determined. Fixed length data consists of data contained in one or more fields. Columns are divisions of fixed length data, and data stored in a column does not necessarily need to be a piece of meaningful data. Columns are pieces of simply divided data, e.g., a column may be divided over fields, and one field may be divided into a plurality of columns. However, the column division is performed in the same manner for a plurality of pieces of fixed length data, and the same column indicates a data block of a similar portion over a plurality of fixed length data.

FIG. 4A illustrates an exemplary functional block configuration of a data compression coding apparatus in accordance with the present embodiment. As depicted in FIG. 4A, an input record is divided into columns by a division means 10, pieces of data of the respective columns are then temporarily stored in registers 11-1 to 11-$m$ each directed to a certain column, and the pieces of data are compression-coded individually for each of columns by column coding means 12-1 to 12-$m$. Pieces of the compression-coded data of the columns are turned into one data stream by a mixture means 13 and output as a coded data output of one record.

It is stated herein that the column coding means 12-1 to 12-$m$ are each provided with an individual coding means, but the present invention is not necessarily limited to this. One coding means may perform a compression-coding process in a time-divisional manner such that each column individually undergoes compression coding. The data compression coding apparatus in accordance with the embodiment is provided at, for example, a sensor node, as in the example of FIG. 1.

Compression coding methods that use the data compression coding apparatus for which a functional block configuration is depicted in FIG. 4A may be entropy coding methods, including, for example, a method such as Huffman coding. When the column coding means 12-1 to 12-$m$ use an entropy coding method, each of the column coding means 12-1 to 12-$m$ has a frequency table and a coding table stored therein as depicted in FIG. 4A.

Such a compression coding method of the embodiment is effective particularly when a fixed-length bit string consists of a plurality of pieces of independent information. Even if the dividing of data into columns is performed in disregard of the boundaries between fields that include independent information of a fixed-length bit string, the average data amount after compression coding can be made small by not taking the correlations between the columns into consideration.

FIG. 4B illustrates another exemplary functional block configuration of a data compression coding apparatus in accordance with the embodiment. In the example depicted in FIG. 4B, arithmetic coding is used.

As depicted in FIG. 4B, in arithmetic coding, in response to input of a record, a division means 10$a$ divides the record into columns, and pieces of data of the columns are held in column registers 11$a$-1 to 11$a$-$m$. Column division span determination means 12$a$-1 to 12$a$-$m$ each calculate a probability of occurrence according to the frequency of a data value that has been read for each column, and determines, for each column, a value for dividing the current range corresponding to the column. Subsequently, a range corresponding to the next column is determined by a range division means from the determined value and the value of the current column.

Accordingly, when the column division span determination means 12$a$-1 directed to column 1 finishes the process, a range division means 18-1 divides, on the basis of the data of column 1 and a result obtained as a result of processing the data of column 1, a range corresponding to column 2 using the arithmetic coding method. Next, the column division span determination means 12$a$-2 directed to column 2 determines a value for diving the range of column 2 according to the probability of occurrence of the data of column 2, and in accordance with the result of the determination and the data of column 2, a range division means 18-2 divides a range for the following column 3. Similarly, the described process is repeated up to column m. Then, a coded data output is obtained via a coding means 19 by coding the input record on the basis of a value at which a binary representation included in a range that is a range dividing result of the range division means 18-$m$ becomes the shortest.

FIG. 5A illustrates an exemplary functional block configuration of a decoding apparatus that corresponds to the data compression coding apparatus depicted in FIG. 4A.

When coded data that has been coded by the data compression coding apparatus depicted in FIG. 4A is input, a division means 16 divides the coded data into columns. A plurality of decoding means 14-1 to 14-$m$ each decode the coded data of each column. In this case, in accordance with a particular coding method, the decoding means 14-1 to 14-$m$ perform the decoding by referring to frequency tables and coding tables 15-1 to 15-$m$ provided for data of each column before coding. When, for example, the coding method is Huffman coding, pieces of coded data are sequentially read, and symbols for the decoded data are generated by referring to the frequency tables and the coding tables provided for the individual columns 1 to m for the symbol pattern of the coded data.

Subsequently, pieces of decoded data that have been decoded for the individual columns are coupled by a mixture means 17 so as to output a decoded record.

FIG. 5B illustrates an exemplary functional block configuration of a decoding apparatus that corresponds to the data compression coding apparatus depicted in FIG. 4B.

In the decoding of arithmetic codes indicated in FIG. 5B, a coded record is input to a column division span determination means 20-1 for column 1. Column division span determination means 20$a$-1 to 20$a$-$m$ each calculate a probability of occurrence according to the frequency of a data value that has been decoded for each column and determine a value for dividing the current range corresponding to the column. Then, column-1 decoding means 14$a$-1 to column-m decoding means 14$a$-$m$ each compare the value for dividing the current range corresponding to each column with the value of coded data so as to determine decoded data for the column. In addition, on the basis of the decoded data and the value for dividing the current range determined in advance, a range corresponding to the subsequent column is determined by the range division means. Pieces of decoded data provided by the column-1 decoding means 14$a$-1 to column-m decoding means 14$a$-$m$ are coupled by a mixture means 17$a$ so as to output a decoded record.

Figure 6:
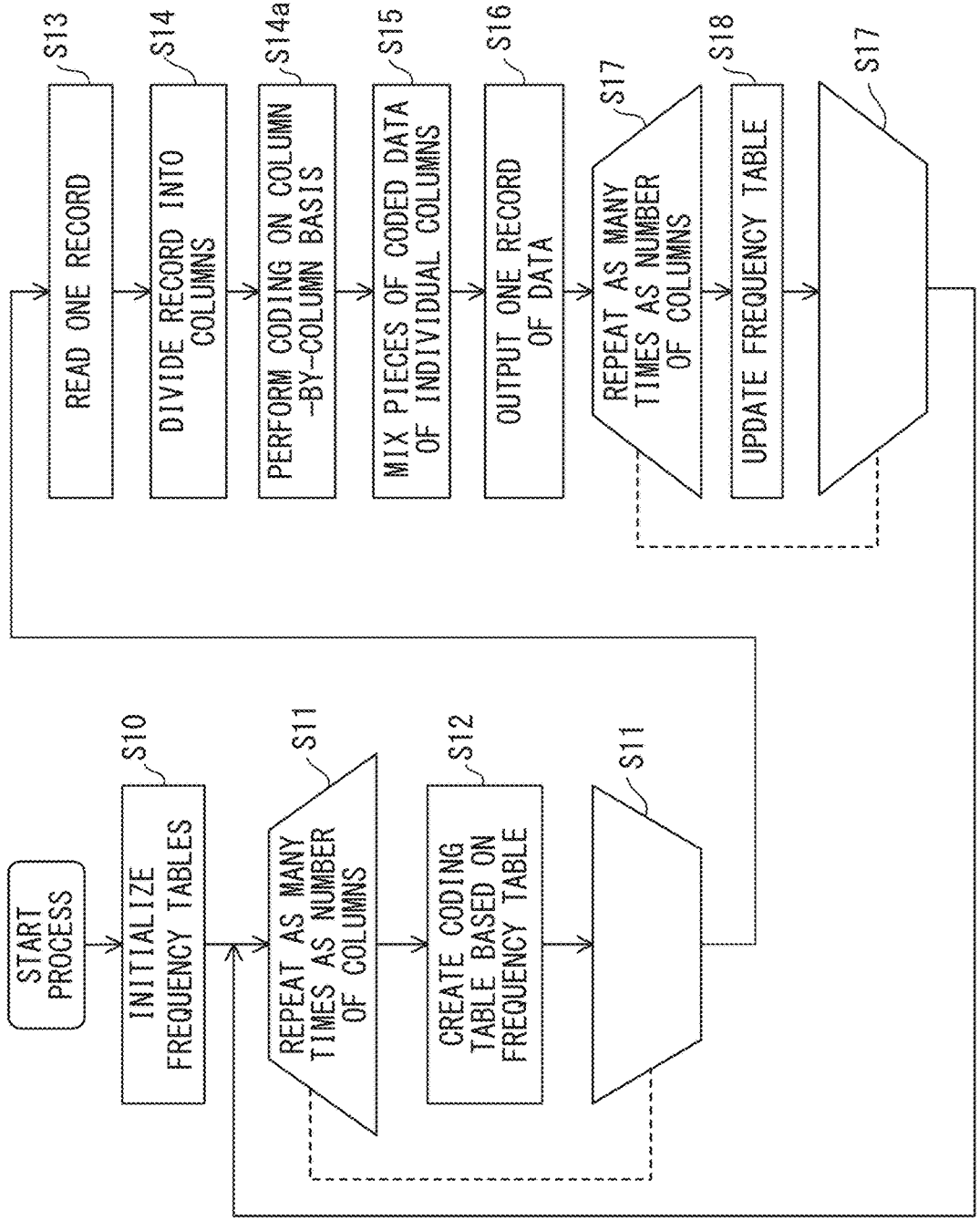
FIG. 6 is a flowchart generally illustrating a data compression coding method of the embodiment using an adaptive entropy coding method.

FIG. 6 is a flowchart generally illustrating a data compression coding method of the embodiment using an adaptive entropy coding method. In an adaptive coding method, pieces of input data are successively compression-coded.

In step S10, frequency tables to be used for entropy coding are initialized. The frequency table is obtained by counting the number of times a certain symbol has emerged in data to be coded. Frequency tables themselves have conventionally been used for entropy coding. The present embodiment has the feature wherein the number of symbols present in columns at the same position in a plurality of records is counted. For example, the initialization may set all entries to 0.

In the loop of step S11, the process of step S12 is repeated as many times as the number of columns of one record. In step S12, a coding table is created on the basis of the frequency table. In the case of Huffman codes, the coding table is a Huffman code dictionary, and in the case of arithmetic codes, the coding table is a probability of occurrence, i.e., a table used when original data is actually replaced with coded information.

When the process has been repeated as many times as the number of columns in step S11, the flow shifts to step S13. In the initial process of step S11, a coding table is created on the basis of the frequency table initialized in step S10.

In step S13, one record that is a fixed-length bit string is read. In step S14, the record is divided into columns in accordance with a method determined in advance. In step S14a, coding is performed on a column-by-column basis, and in step S15, pieces of the coded data of the individual columns are mixed to form compression-coded data for one record. In step S16, data for one record after the compression coding is output. When this data has been output for all records, this means that the compression coding of the input data has been completed.

After step S16, the flow shifts to step S17, and the process of step S18 is repeated as many times as the number of columns. In step S18, the frequency tables are updated. The frequency tables are independent for the individual columns, and the number of frequency tables is equal to the number of columns. The update of the frequency table does not use pieces of data in other columns, and as records are sequentially coded, frequency of symbols appearing in corresponding columns of the input records is individually updated.

When the loop process of step S17 is finished, the flow returns to step S11, and a coding table is created on the basis of the frequency tables of the columns updated in the loop process in step S17. Then, the flow shifts to step S13 to start the coding process for the next record. When there are no longer records to be processed, the compression coding is completed.

Some schemes that correspond to the entropy coding scheme will be described in the following in more detail by referring to specific examples.

Figure 7:
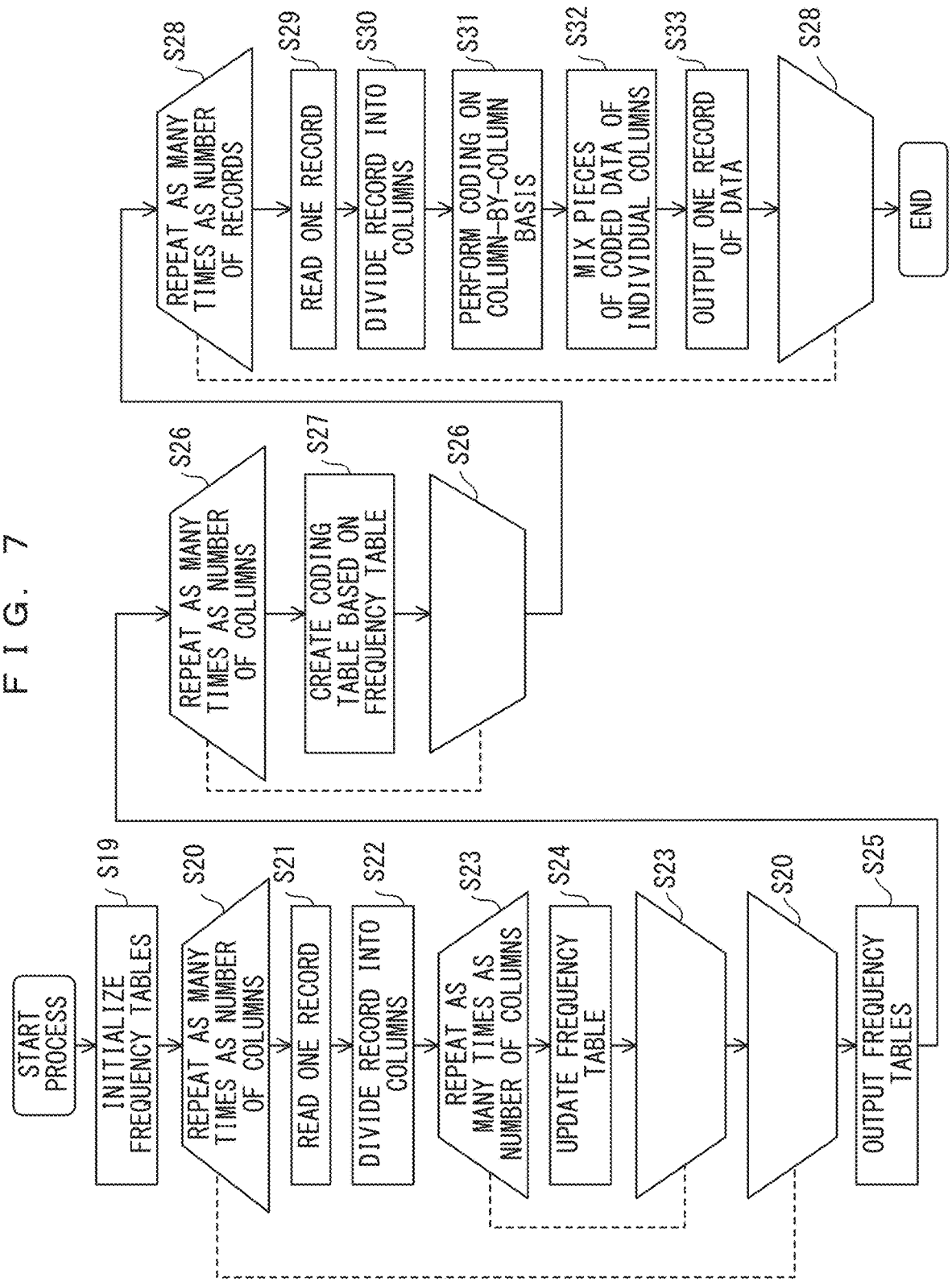
FIG. 7 is a flowchart generally illustrating a data compression coding method of the embodiment using an accumulative entropy coding method.

FIG. 7 is a flowchart generally illustrating a data compression coding method in accordance with the embodiment using an accumulative entropy coding method. In an accumulative coding method, all pieces data to be compression-coded is read and then compression-coded. In particular, all pieces of data to be coded is temporarily read to complete frequency tables, and then the data is read again and coded.

In step S19, frequency tables are initialized. In the loop of step S20, for all records of the pieces of data to be coded, the process is repeated as many times as the number of records. In step S21, one record is read, and in step S22, the record is divided into columns using a method determined in advance. In the loop of step S23, the process of step S24 is repeated as many times as the number of columns. In step S24, the frequency tables each provided for each individual column are updated. When the process has been repeated as many times as the number of columns in step S23, it is determined whether the process has been repeated as many times as the number of records in step S20; when it is determined that the repeating process has not been finished yet, the repeating process is continued, and when it is determined that the repeating process has been finished, the flow shifts to step S25. At the moment at which the flow shifts to step S25, the update of the frequency tables has been finished for all pieces of data to be coded, and hence the frequency tables are output. Then, the flow shifts to step S26.

In step S26, the process of step S27 is repeated as many times as the number of columns. In step S27, a coding table is created from the frequency table. In the case of Huffman codes, the coding table is a Huffman code dictionary, and in the case of arithmetic codes, the coding table is a probability of occurrence, i.e., a table used when original data is actually replaced with coded information. When the process has been repeated as many times as the number of columns in step S26, the flow shifts to step S28.

In step S28, the process is repeated as many times as the number of records included in data to be coded. In step S29, one record is read, and in step S30, the record is divided in accordance with method determined in advance. In step S31, compression coding is performed for each column, and in step S32, pieces of compression-coded data are mixed to obtain compression-coded data for the one record. In step S33, the data for one record is output. When the process has been repeated as many times as the number of records in the loop process of step S28, the process ends.

When, for example, data to be compression-coded is fixed length data received from a sensor or the like, the number of records of the data to be compression-coded depends on the amount of data to be collectively compression-coded. The volume of data to be collectively compression-coded depends on the capacity of the memory of a coding machine, and this should be determined as appropriate by a person skilled in the art who uses the present embodiment. In response to data being sequentially transmitted from a transmission source, the collective compression-coding of the above-described data is repeated.

Figure 8:
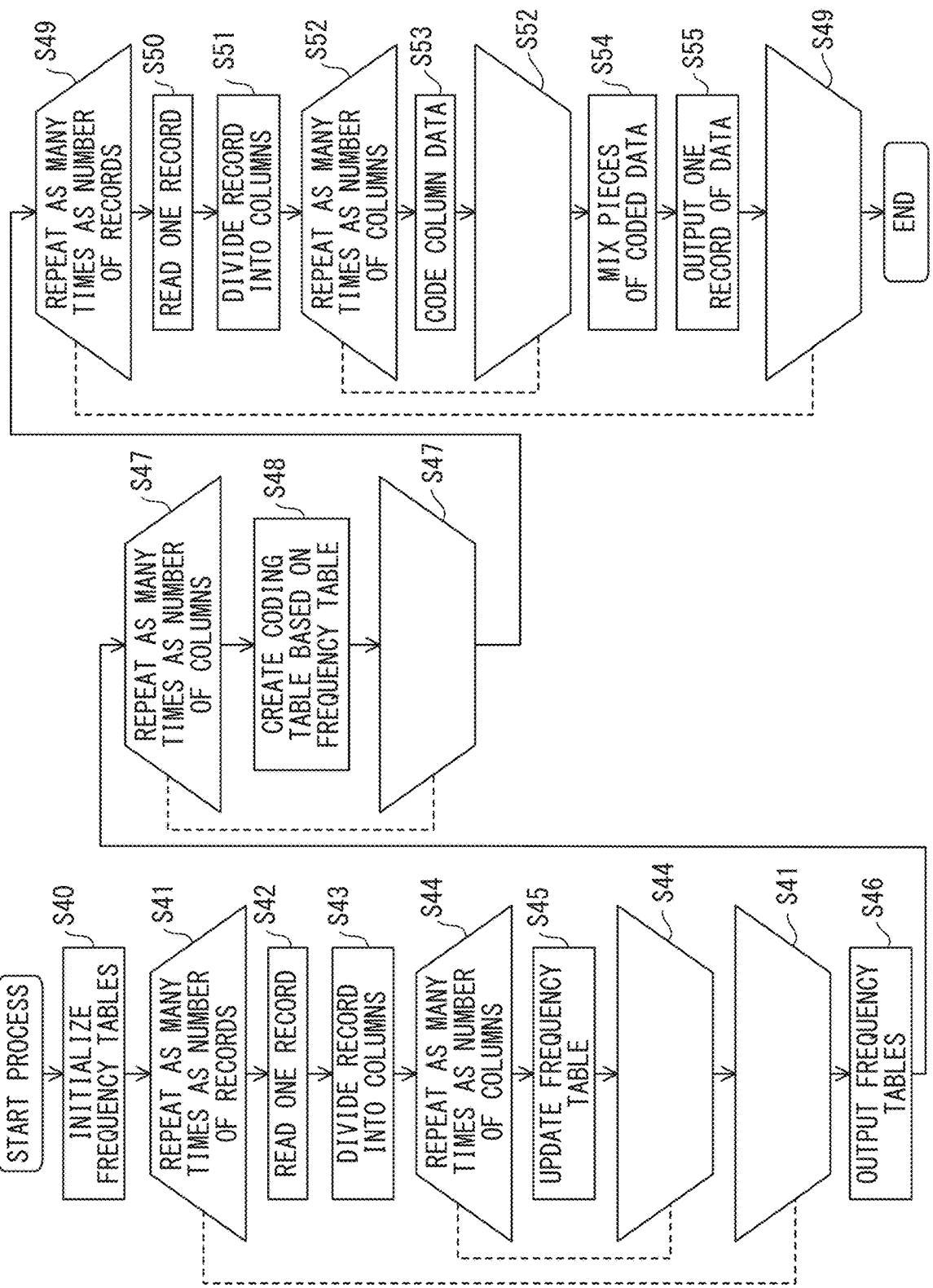
FIG. 8 is a flowchart illustrating an accumulative Huffman coding method.
Figure 9:
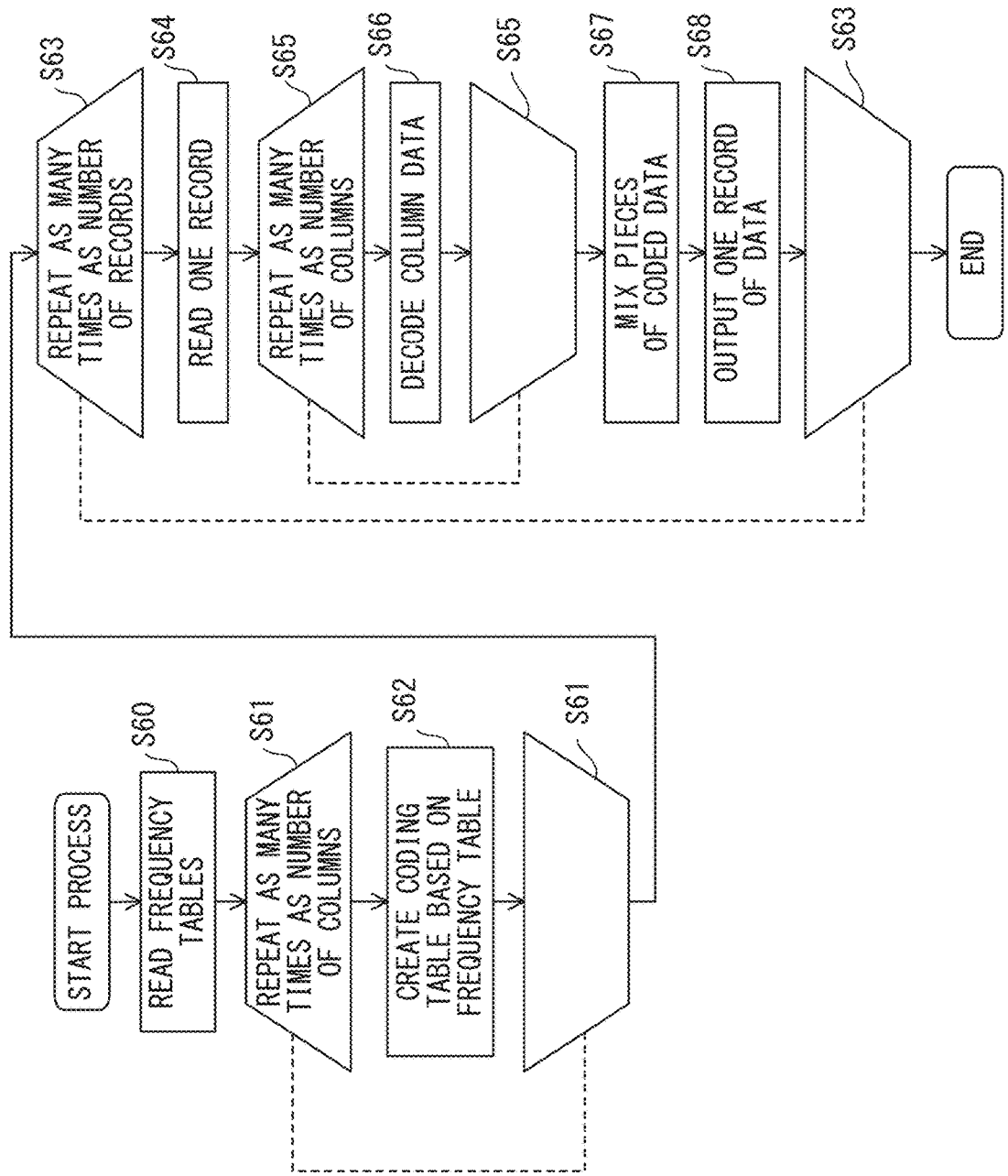
FIG. 9 is a flowchart illustrating an accumulative Huffman decoding method.

FIGS. 8 and 9 are flowcharts illustrating an accumulative Huffman coding method and an accumulative Huffman decoding method in more detail.

In the accumulative Huffman coding method depicted in FIG. 8, frequency tables are initialized in step S40. In the loop of step S41, the processes between steps S41 are repeated as many times as the number of records. In step S42, one record is read, and in step S43, the record is divided into columns using a predetermined method. In the loop of step S44, step S45 is repeated as many times as the number of columns. In step S45, the frequency tables are updated for the individual columns. When the frequency tables of all columns have been updated, the frequency tables are output in step S46, and the flow shifts to the loop of step 47.

In the loop of step S47, the process of step S48 is repeated as many times as the number of columns. In step S48, a coding table is created on the basis of the frequency table.

In the loop of step S49, the processes between steps S49 are repeated for the records. In step S50, one record is read.

In step S51, the record is divided into columns using a predetermined method. In the loop of step S52, the process of step S53 is repeated as many times as the number of columns. In step S53, column data is coded. In step S54, pieces of the coded data determined in the loop of step S52 are mixed to produce one record. In step S55, data for one record is output. When the process has been performed as many times as the number of records, the process ends.

In the accumulative Huffman decoding method depicted in FIG. 9, frequency tables are read in step S60. In the loop of step S61, step S62 is repeated as many times as the number of columns. In step S62, a code table is created on the basis of the frequency table. In the loop of step S63, the processes between steps S63 are repeated as many times as the number of records. In step S64, coded data for one record is read. In the loop of step S65, step S66 is repeated as many times as the number of columns. In step S66, column data is decoded on the basis of the coding table created in step S62. In step S67, pieces of the coded data of the individual columns are mixed to produce one record. In step S68, data for one record is output. When the process has been performed as many times as the number of records, the process ends.

Figure 10:
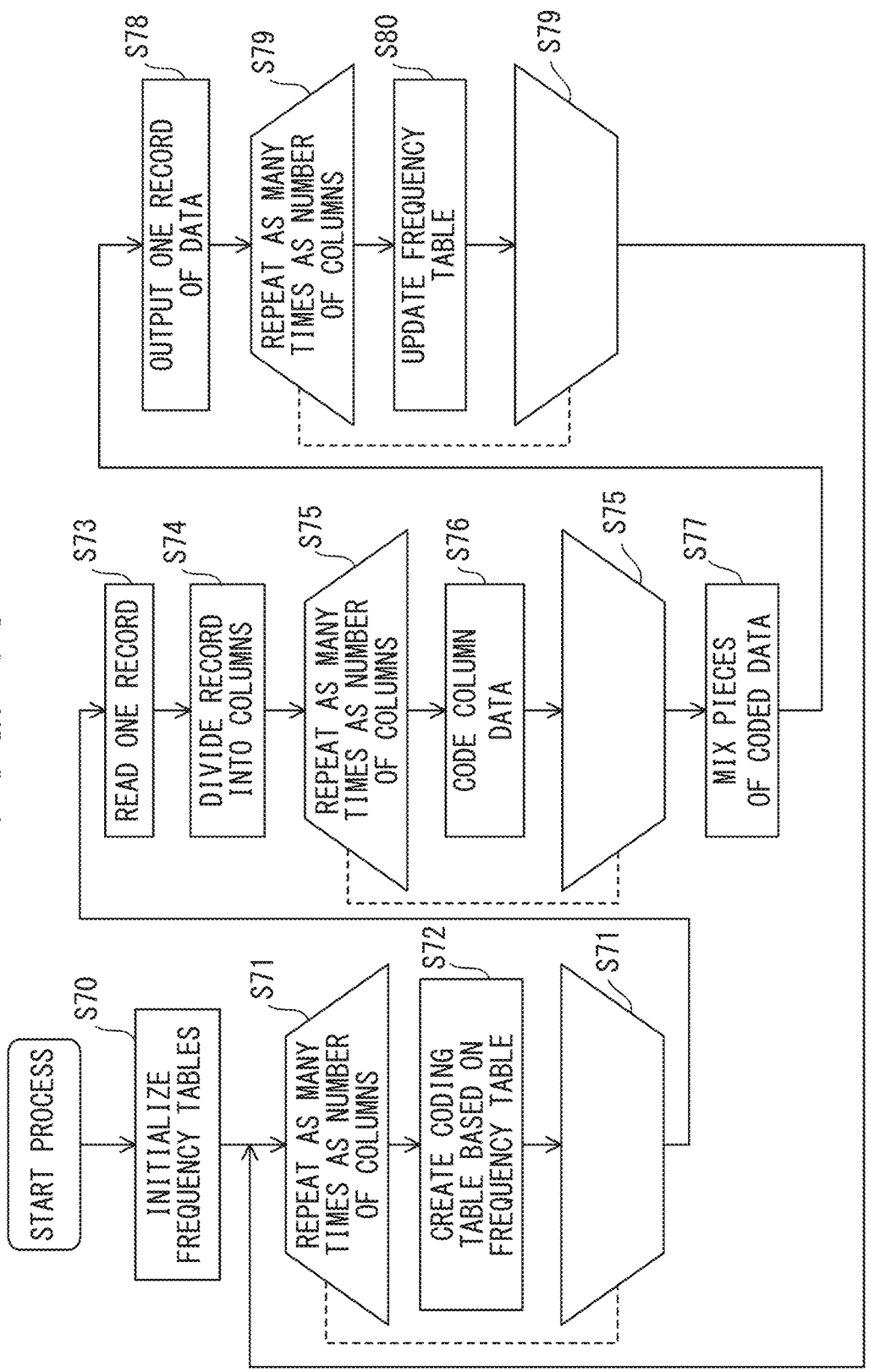
FIG. 10 is a flowchart illustrating an adaptive Huffman coding method.
Figure 11:
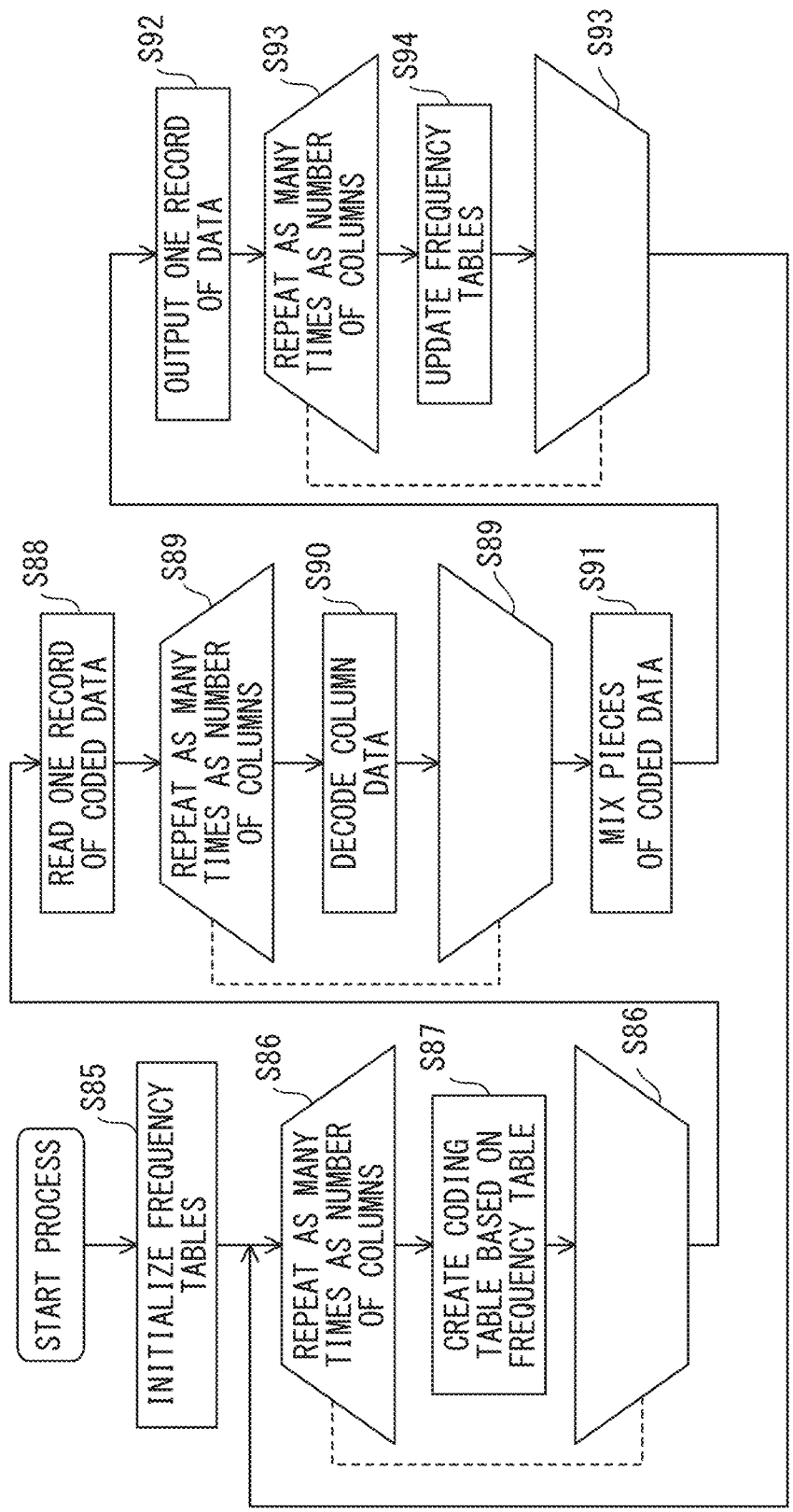
FIG. 11 is a flowchart illustrating an adaptive Huffman decoding method.

FIGS. 10 and 11 are flowcharts illustrating an adaptive Huffman coding method and an adaptive Huffman decoding method.

In the adaptive Huffman coding method depicted in FIG. 10, frequency tables are initialized in step S70. In the loop of step S71, the process of step S72 is repeated as many times as the number of columns. In step S72, in the initial process, a coding table is created on the basis of the frequency table initialized in step S70, and in each of the following processes, a coding table is created on the basis of the frequency table updated in step S80. In step S73, one record is read. In step S74, the record is divided into columns using a predetermined method. In the loop of step S75, the process of step S76 is repeated as many times as the number of columns. In step S76, column data is coded on the basis of the coding table created in step S72. In step S77, pieces of the coded data of the individual columns are mixed to produce one record. In step S78, data for one record is output. In the loop of step S79, the process of step S80 is repeated as many times as the number of columns. In step S80, the frequency table of the column is updated. When the process has been repeated as many times as the number of columns, the flow returns to step S71 to create a coding table, and the processes of step S73 and the following steps are repeated for the next record.

The adaptive Huffman decoding method depicted in FIG. 11 is intended to decode data that has been coded by using the adaptive Huffman coding method depicted in FIG. 10. Coded data is decoded by inversely consulting coding tables used for coding so as to determine the data of the original columns from the coded data. Accordingly, the flow depicted in FIG. 11 is the flow depicted in FIG. 10 with the step of coding column data and the step of mixing pieces of coded data replaced with the step of decoding column data and the step of mixing pieces of decoded data, with the step of reading one record replaced with the step of reading one record of coded data, and with the step of outputting coded data replaced with the step of outputting a decoded record.

As depicted in FIG. 11, in step S85, frequency tables are initialized. In the loop of step S86, the process of step S87 is repeated as many times as the number of columns. In step S87, in the initial process, a coding table is created on the basis of the frequency table initialized in step S85, and in each of the following processes, a coding table is created on the basis of the frequency table updated in step S94. In step S88, coded data for one record is read. In the loop of step S89, the process of step S90 is repeated as many times as the number of columns. In step S90, column data is decoded on the basis of the coding table created in step S87. In step S91, pieces of decoded data of the individual columns are mixed to produce one record. In step S92, data for one record is output. In the loop of step S93, the process of step S94 is repeated as many times as the number of columns. In step S94, the frequency table of the column is updated. When the process has been repeated as many times as the number of columns, the flow returns to step S86 to create a coding table, and the processes of step S88 and the following steps are repeated for the next record.

Figure 12:
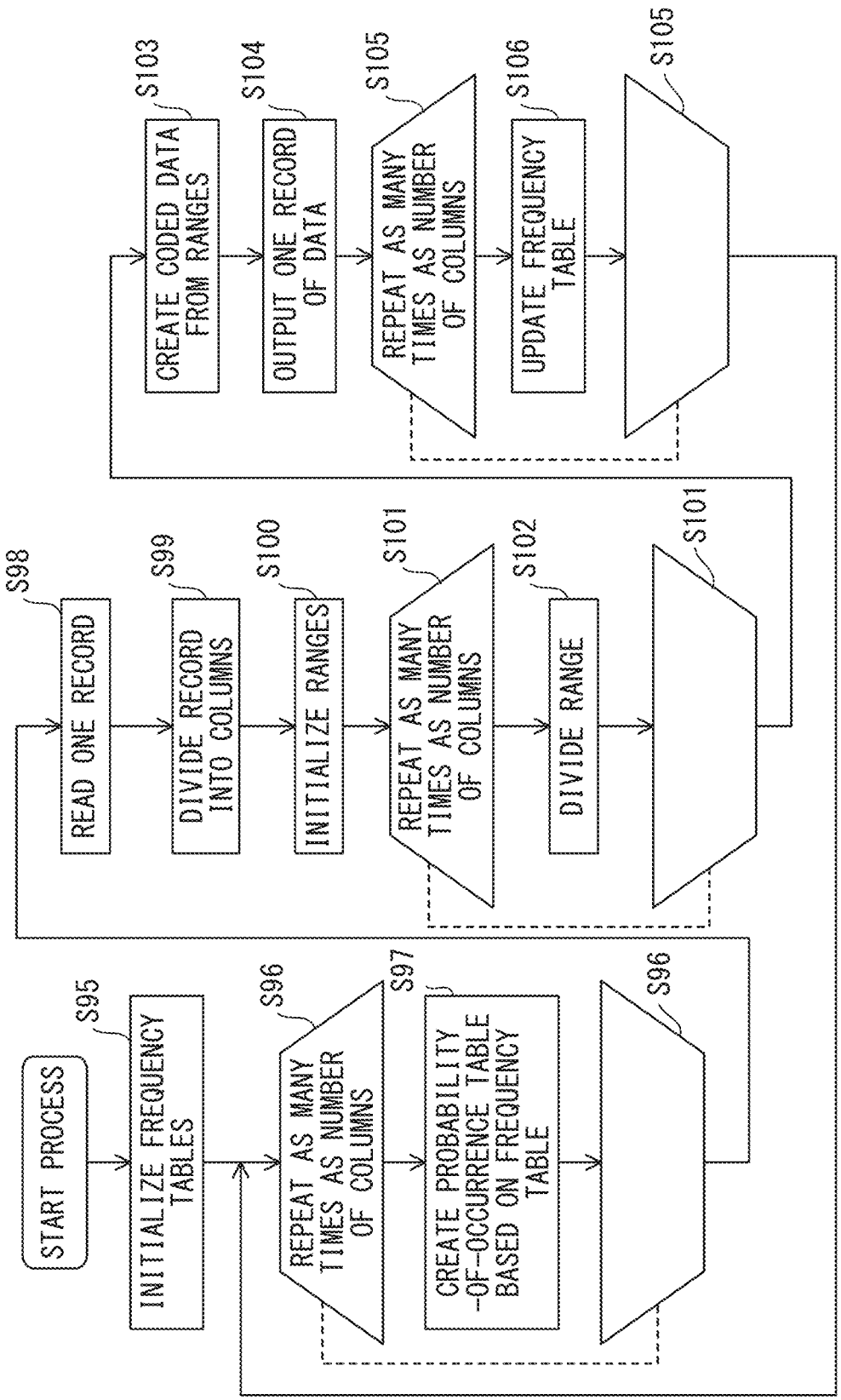
FIG. 12 is a flowchart illustrating an adaptive arithmetic coding method.
Figure 13:
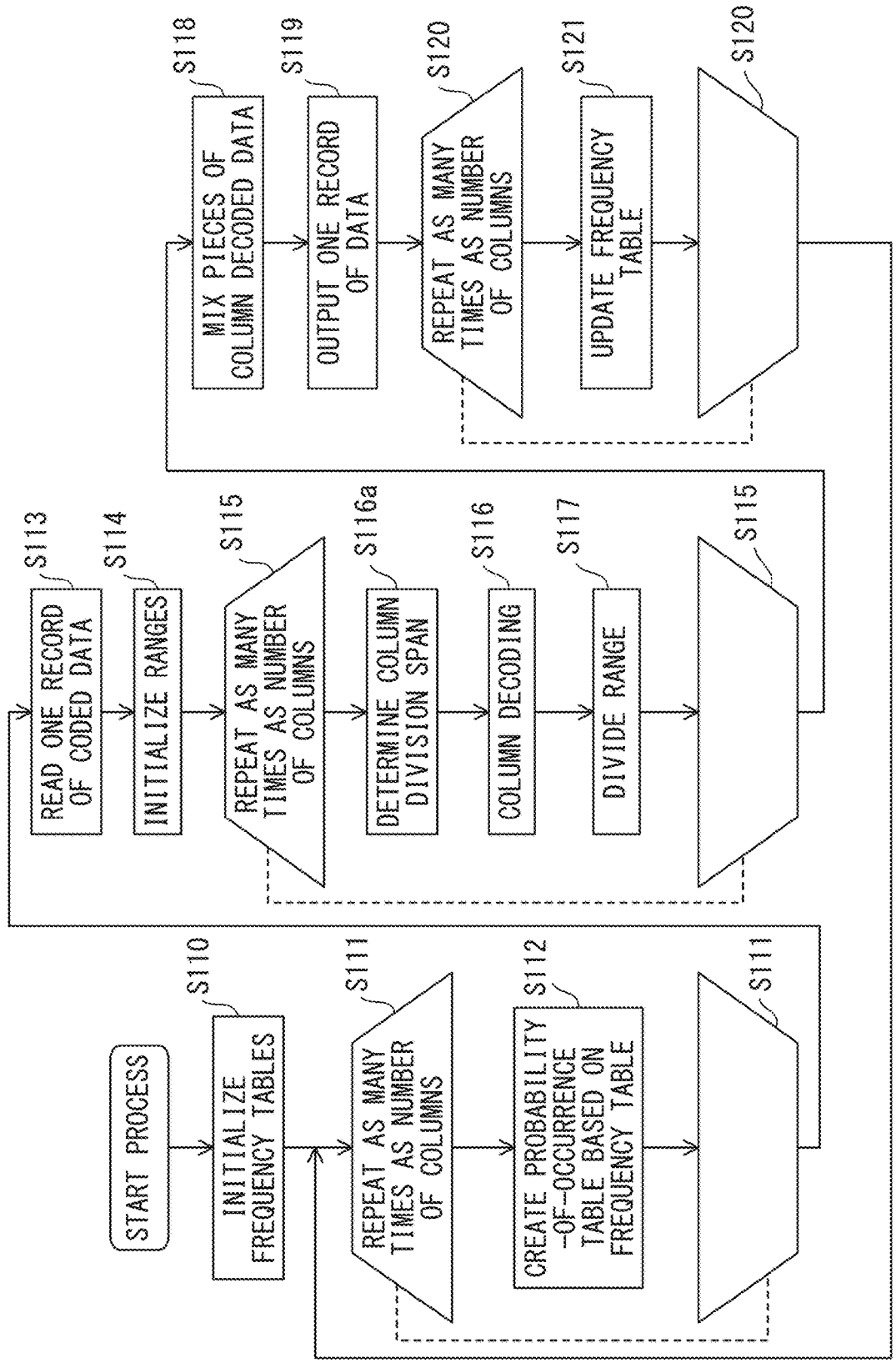
FIG. 13 is a flowchart illustrating an adaptive arithmetic decoding method.

FIGS. 12 and 13 are flowcharts illustrating an adaptive arithmetic coding method and an adaptive arithmetic decoding method. These flowcharts correspond to the configurations of the functional blocks described above with reference to FIGS. 4B and 5B, and by using programs for executing algorithms indicated in the flowcharts, an adaptive arithmetic coding apparatus and an adaptive arithmetic decoding apparatus can be implemented on a computer.

In the adaptive arithmetic coding method depicted in FIG. 12, frequency tables are initialized in step S95. In the loop of step S96, the process of step S97 is repeated as many times as the number of columns. In step S97, in the initial process, probability-of-occurrence tables are created on the basis of the frequency table initialized in step S95, and in each of the following processes, a probability-of-occurrence table is created on the basis of the frequency table updated in step S106. In step S98, one record is read. In step S99, the record is divided into columns using a predetermined method. In step S100, ranges are initialized. In the loop of step S101, the process of step S102 is repeated as many times as the number of columns. In step S102, a range is divided in accordance with the arithmetic coding method. In step S103, coded data is created from the range eventually obtained in the loop of step S101. In step S104, the coded data is output as the coded data for one record. In the loop of step S105, the process of step S106 is repeated as many times as the number of columns. In step S106, the frequency table is updated. When the process has been performed as many times as the number of columns, the flow returns to step S96 to create a probability-of-occurrence table, and the processes of step S98 and the following steps are repeated for the next record.

The adaptive arithmetic decoding method depicted in FIG. 13 is intended to decode data that has been coded using the adaptive arithmetic coding method depicted in FIG. 12.

As depicted in FIG. 13, frequency tables are initialized in step S110. In the loop of step S111, the process of step S112 is repeated as many times as the number of columns. In step S112, a probability-of-occurrence table is created on the basis of a frequency table. In step S113, coded data for one record is read. In step S114, ranges are initialized. In the loop of step S115, the processes of steps S116a, S116, and S117 are repeated as many times as the number of columns. In step S116a, a probability of occurrence is calculated according to the frequency of a decoded data value in each column, and a value for diving a current range corresponding to the column is determined. In step S116, the value for dividing a current range corresponding to each column and the value of coded data are compared to determine decoded data for the column. In step S117, on the basis of the decoded data determined in step S116 and the value for dividing a current range determined in step S116a, a range corresponding to the next column is determined. In step S118, pieces of the column decoded data determined in step S116 are mixed to produce one record. In step S119, data for one record is output. In the loop of step S120, the process of step S121 is repeated as many times as the number of columns. In step S121, the frequency table of each column is updated. When the process has been performed as many times as the number of columns, the flow returns to step S111 to create a probability-of-occurrence table, and the processes of step S113 and the following steps are repeated for the next record.

The data compression coding method and the decoding method in accordance with the embodiment have been described by referring to FIGS. 6-13, and by using programs that rely on algorithms indicated in the flowcharts depicted in these figures, the data compression coding apparatus and the decoding apparatus in accordance with the embodiment can be implemented on a computer.

Next, descriptions will be given of the data compression coding/decoding of the embodiment using specific examples of records.

FIGS. 14A-22B illustrate exemplary processes of the data compression coding method of the present embodiment.

Figures 14A, 14B:
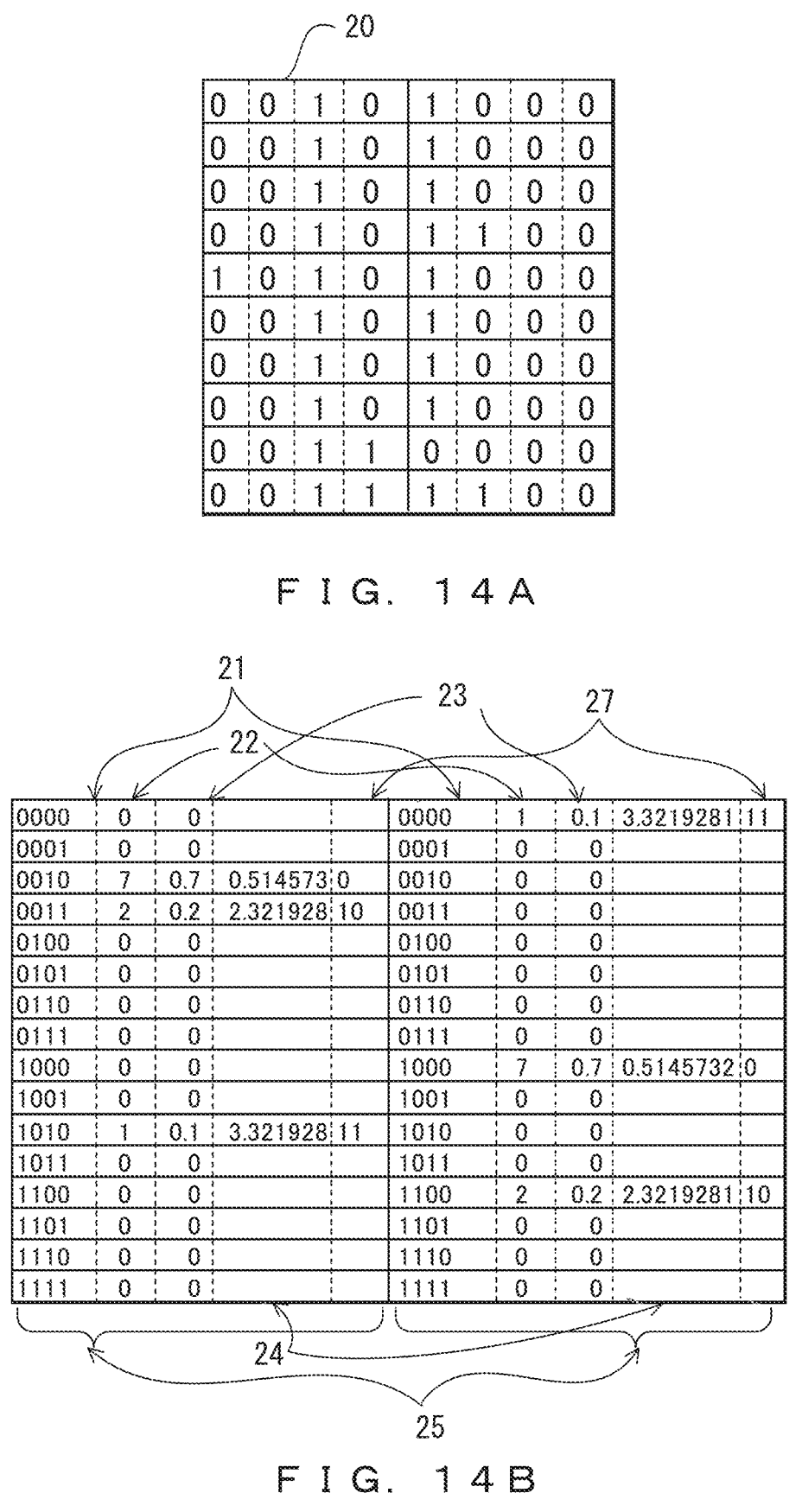

FIGS. 14A-14C illustrate the accumulative Huffman coding method of the embodiment on the basis of specific examples. In the examples depicted in FIGS. 14A-14C, ten records are accumulated and then collectively compression-coded.

FIG. 14A indicates a record group 20 consisting of ten records each with a fixed length of eight bits. Each record is divided into, for example, columns 1 and 2 each with a width of four bits. In the descriptions of other coding schemes hereinafter, the record group 20 will also be used as a record group to be coded.

FIG. 14B indicates an example of a code dictionary 25 achieved when Huffman codes are used. For the conventional method for Huffman coding, see non-patent document 1. In the present embodiment, the code dictionary 25 is provided for each individual column. The same code dictionary is used for identical columns. In the case of FIGS. 14A-14C, one record is divided into two columns, and hence two code dictionaries are provided.

In FIG. 14B, reference mark 21 indicates data that may appear for each column. Accordingly, since one column consists of four bits, there are sixteen permutations of 0 and 1. Hence, to cover all combinations of these bits, the code dictionary 25 consists of sixteen rows.

Reference mark 22 indicates an occurrence count for each bit pattern in the record group 20. The probability of occurrence determined from the occurrence count for each piece of data is indicated by reference mark 23, and reference mark 24 indicates self-information entropy. The probability of occurrence 23 is obtained by dividing the occurrence count 22 by the number of records. For example, in the left code dictionary indicated as reference mark 25, the occurrence count of "0010" is seven, and the total number of records is ten, and hence the probability of occurrence 23 is 7/10=0.7. Meanwhile, S=−log(p) is satisfied, where S indicates a self-information entropy 24, and p indicates a probability of occurrence 23. Coding is performed on the basis of the probability of occurrence 23 or the self-information entropy 24.

Reference mark 27 indicates coded data of each column obtained from the coding described above. Coded data obtained by compression-coding a record is obtained by coupling these Huffman codes. Reference mark 26 in FIG. 14C indicates coded data for individual records of the record group 20. When the record group 20 and the coded data 26 are compared, the data amount is found to have been decreased, and in this method, the code dictionary used in compression coding needs to be referred to in performing decoding, and hence the frequency table identified as reference mark 22 (or the code dictionary identified as reference mark 25) also needs to be communicated. The accumulation types illustrated in FIGS. 14A-14C are suitable for collectively compression-coding some records.

According to the descriptions based on FIGS. 6 and 7, a frequency table and a coding table are separate, but in the examples of FIGS. 14A-14C, a frequency table is included in a coding table.

FIGS. 15A-17B each illustrate an adaptive Huffman coding method of the embodiment on the basis of a specific example. In the adaptive coding/decoding method, probabilities of occurrence or frequencies of occurrence do not need to be determined in advance, and record data can be coded immediately at the time of generation of the record data. And the coded information can be immediately decoded.

FIG. 15A depicts a coding table 25 which is in an initial state identified as reference mark 30-1, a record group 20, and coded data 31-1. The input record group 20 is the same as that depicted in FIG. 14.

The structure of the coding table 25 is the same as that of the code dictionary 25 depicted in FIG. 14. However, only in FIG. 15A, like items are given like reference marks to those depicted in FIG. 14. Laplace smoothing has been applied to the frequency table 22 included in the code dictionary 25 in the initial state so as to set all values to "1". On the basis of this frequency, a probability of occurrence, a self-information entropy, and a Huffman code are determined, and using this code, the initial record is coded. The coding result is the same value as the input record, as indicated by coded data 31-1. In the initial state, all frequencies are equal, and hence an effect of compression cannot be obtained.

Figure 15B:
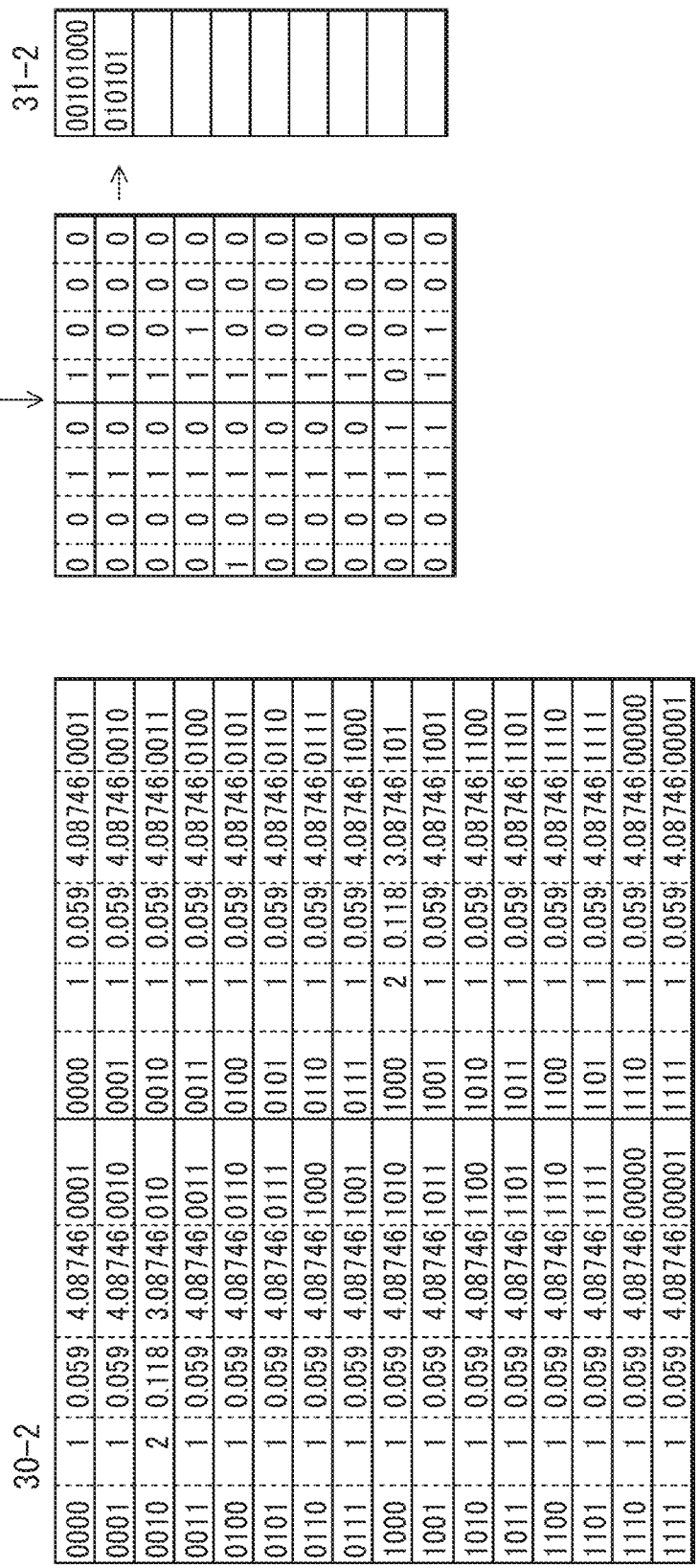
FIG. 15B illustrates an adaptive Huffman coding method of the embodiment on the basis of a specific example (stage 2)

Next, the frequency table is updated on the basis of the initial record. The frequencies of items corresponding to the data that has occurred is incremented by a certain value. As depicted in FIG. 15B, the number of occurrences has been incremented by 1 for "0010" in the left column and "1000" in the right column. The coding tables 25 indicated as 30-2 are obtained by determining probabilities of occurrence and self-information entropies again on the basis of that frequency table, and the Huffman code determined on the basis of that frequency table is indicated in coded data 31-2. In comparison with the initial record for which a compression effect has not been obtained, coded data 31-2 indicates that a compression effect has been achieved.

Figure 16A:
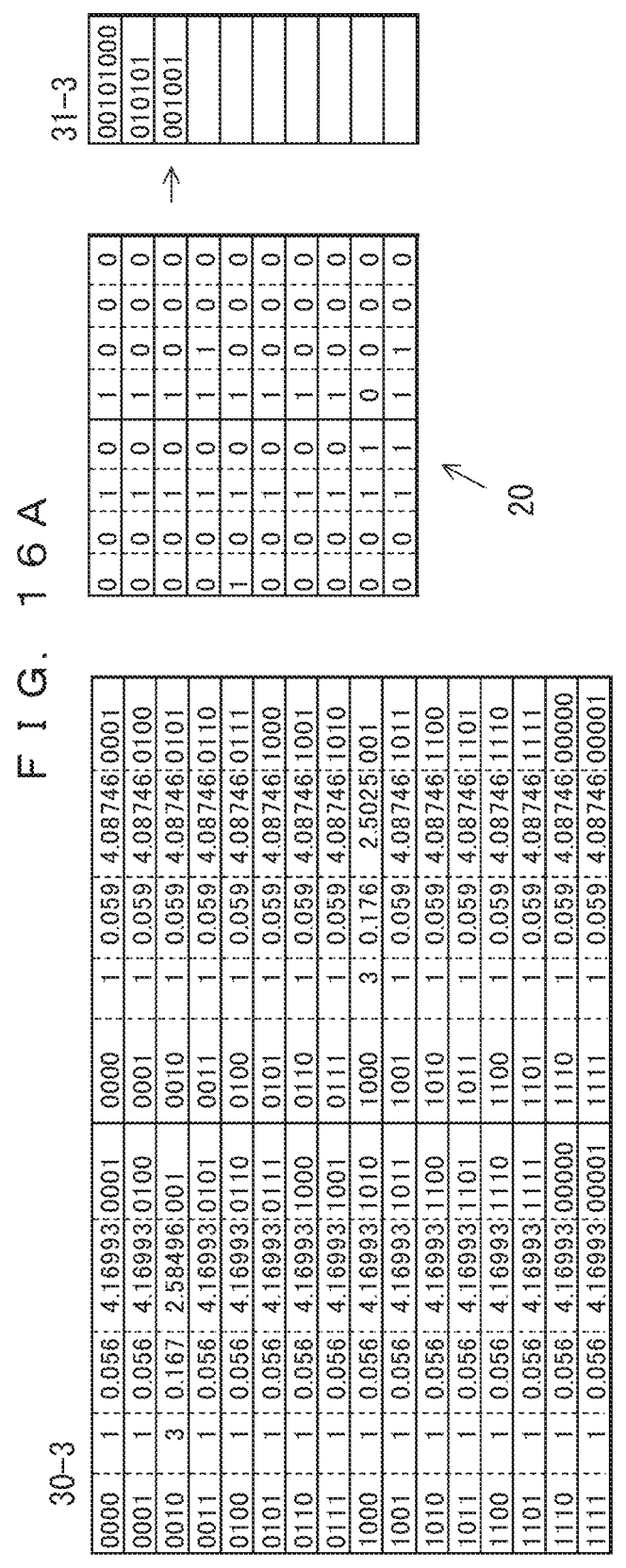

Next, as depicted in FIG. 16A, "0010" occurs again in the left column of the third record, and "1000" occurs again in the right column; accordingly, the item of "0010" in the left frequency table and the item of "1000" in the right frequency table are updated to 3 in the coding table indicated as 30-3. A result of the performing of the Huffman coding based on this frequency table is indicated by coded data 31-3.

Figure 16B:
FIG. 16B illustrates an adaptive Huffman coding method of the embodiment on the basis of a specific example (stage 4)

In addition, in FIG. 16B, since "0010" and "1100" respectively occur in the left and right columns of the fourth record, the item of "0010" is updated to 4 in the left frequency table in the coding table indicated as 30-4. The item of "1100" in the right frequency table, which occurs for the first time, is not updated because the initial value is 1. A result of the performing of the Huffman coding based on this frequency table is indicated by coded data 31-4.

Figure 17A:
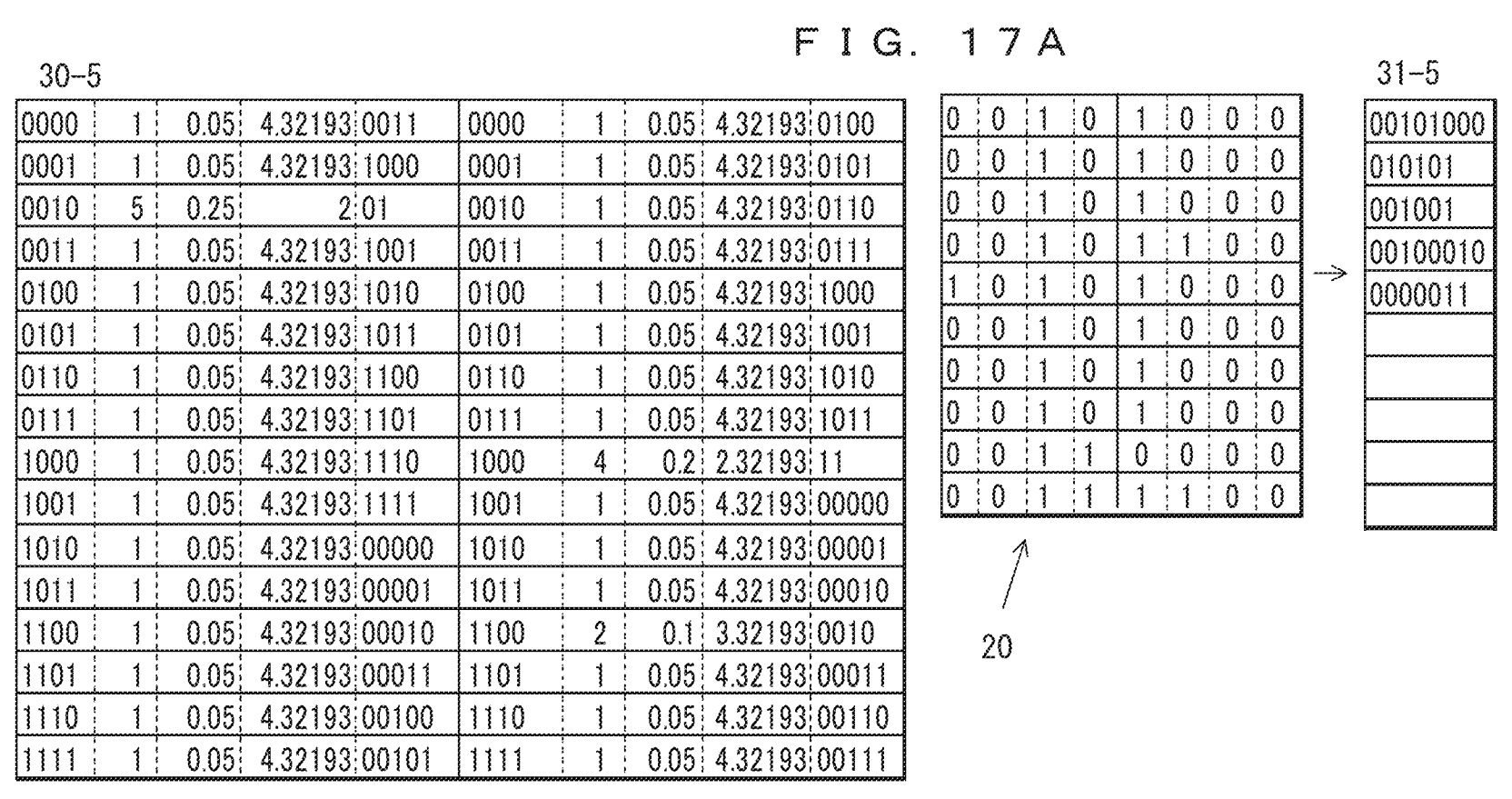

Moreover, in FIG. 17A, since "1010" and "1000" respectively occur in the left and right columns of the fifth record, the item of "1010" is maintained at the initial value of 1 in the left frequency table in the coding table indicated as 30-5. The item of "1000" in the right frequency table is updated to 4. A result of the performing of the Huffman coding based on this frequency table is indicated by coded data 31-5.

Figure 17B:
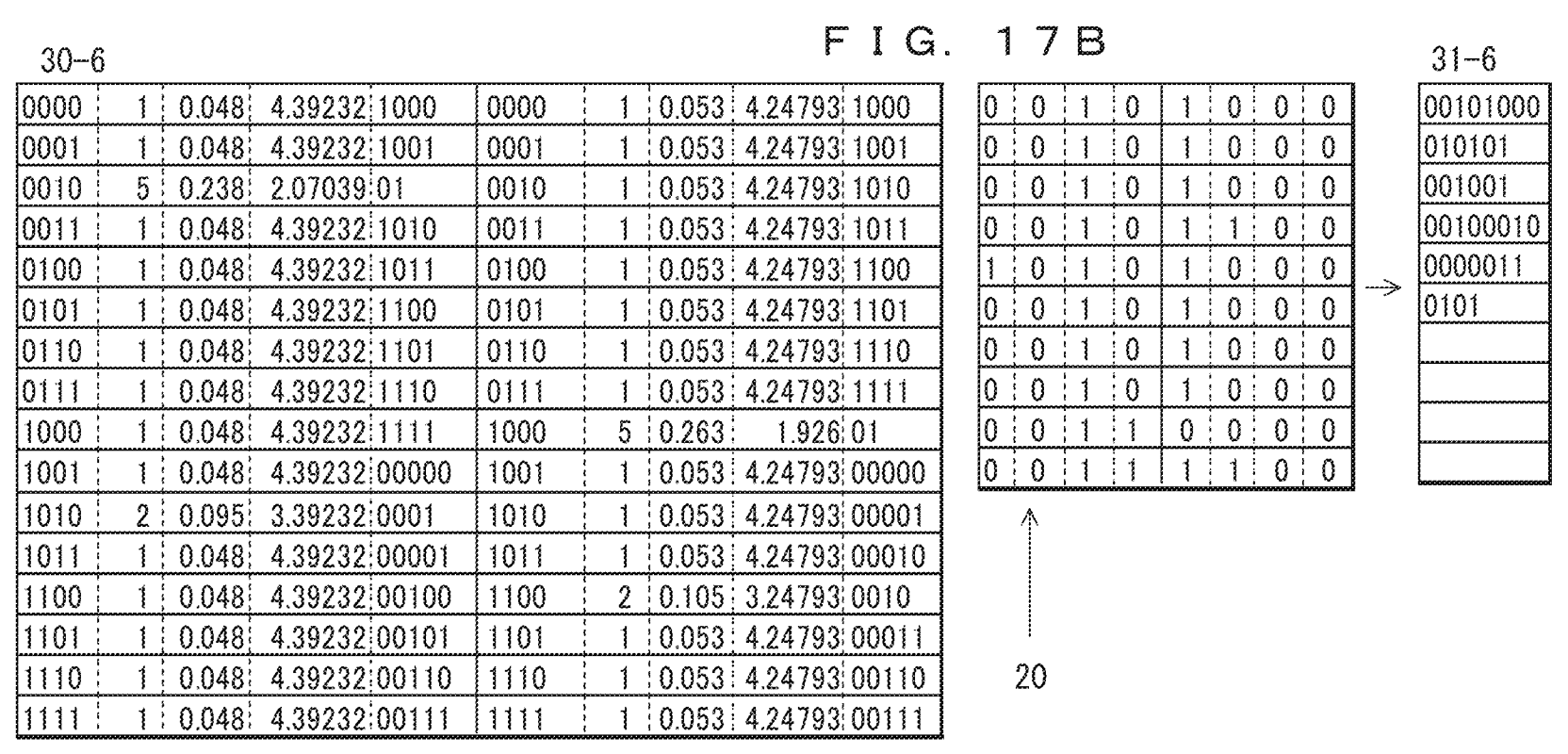

In addition, in FIG. 17B, since "0010" and "1000" respectively occur in the left and right columns of the sixth record, the item of "0010" is updated to 5 in the left frequency table in the coding table indicated as 30-6. The item of "1000" in the right frequency table is updated to 5. A result of the performing of the Huffman coding based on this frequency table is indicated by coded data 31-6.

Coding is sequentially performed by repeating the process as described above. FIGS. 17A and 17B each indicate a coding table for six records, but coding can be performed in a similar manner for all records by performing coding by updating the frequency tables and repeatedly determining probabilities of occurrence, self-information entropies, and Huffman codes.

As described above, when the adaptive coding method is used, a code dictionary does not need to be communicated so that the compression effect can be obtained even for data with few records.

FIGS. 18A to 22B each illustrate, on the basis of a specific example, a data compression coding method of the embodiment with column division performed on a bit-by-bit basis.

This method allows the capacity of memory for holding a frequency table in performing coding or decoding to be decreased.

When the dividing is performed on a bit-by-bit basis, coding can be performed by applying the arithmetic coding method. The frequency is updated while sequentially performing coding in a column direction, and hence an adaptive binary arithmetic coding method is used. The conventionally known arithmetic coding method may be used as the method for arithmetic coding itself. See non-patent document 1 if necessary.

The input record group 20 is the same as that depicted in FIG. 14A with column division applied thereto on a bit-by-bit basis.

Figure 18A:
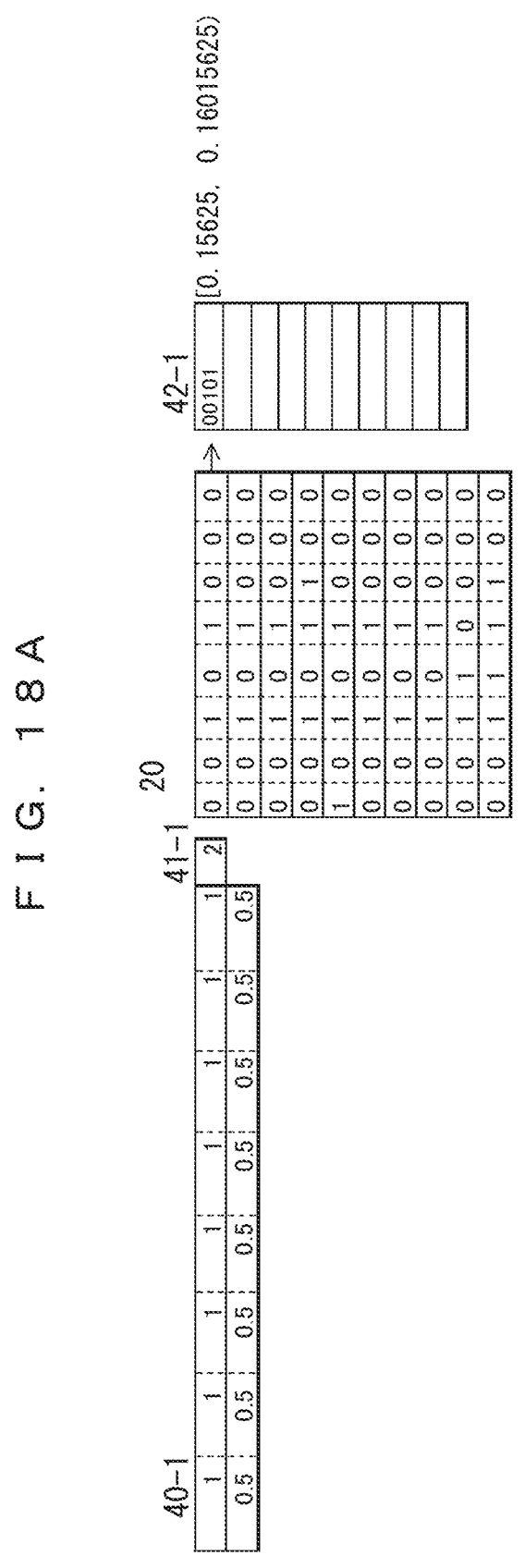

The upper side of the table 40-1 depicted in FIG. 18A indicates frequencies, and the lower side indicate corresponding probabilities of occurrence. This also applies to FIGS. 18A to 22B described hereinafter. The table 40-1 is in the initial state. Although respective frequencies would be necessary for data of "0" and data of "1", frequencies are indicated for only "0" in the table 40-1. A section for total record count 41-1 is provided instead of indicating a frequency of "1". The frequency of "1" can be determined by subtracting the frequency of "0" from the total record count. Using Laplace smoothing again, the initial value of frequency of "0" is set to 1, and the initial value of the total record count is set to 2. The probability of occurrence of "0" determined from this frequency is indicated in the lower side of the table 40-1. A probability of occurrence can be a frequency divided by a total record count. The probability of occurrence of "1" can be (1−(probability of occurrence of "0")).

Arithmetic coding is performed on the basis of this probability of occurrence. In the present embodiment, independent probabilities of occurrence (frequencies) for individual columns (in this example, for individual bits) are used. Coded data 42-1 indicates the arithmetic coding result of the first record. The value of the range determined from the arithmetic coding is indicated on the right side of coded data 42-1. The decimal part of the value in binary notation that can be expressed using the lowest bit count included in the range is the result of the arithmetic coding. In this example, 0.00101 (binary number)=0.15625 (decimal number) is obtained, and hence the result is "00101". In arithmetic coding, a "0" located at the end of a coding result can typically be decoded even when this character is omitted, and accordingly in this example, the "0" located at the end is omitted as usual. In the present embodiment, a record is divided into columns on a bit-by-bit basis for coding, and hence the frequency is determined independently of the frequencies of other bits within the record; however, for different records, the frequencies of bit occurrence that depend on bit positions are counted (e.g., the frequency of bit occurrence of the first bit, the frequency of bit occurrence of the second bit . . . ). Accordingly, a probability of occurrence is obtained by dividing the number of "0"s that occur at predetermined bit positions by the number of processed records. The probability of occurrence of "1" is obtained by subtracting the probability of occurrence of "0" from 1.

The table 40-2 in FIG. 18B indicates the frequencies of occurrence and probabilities of occurrence of the second record updated after the first record is coded. Since only the frequency of "0" is determined, only the frequencies of the sections at which "0" occurred in the first record have been incremented by 1 in the table 40-2. The initial value is maintained for the frequencies of the third and fifth bits at which "1" occurred. The total record count 41-2 has been increased to 3. The lower side of the frequency table 40-2 indicates the probabilities of occurrence determined from the frequencies and the total record count. The result of the arithmetic coding performed according to the probabilities of occurrence is indicated in association with the second record in the second of the coded data 42-2. This indicates that the value of the range of the arithmetic coding has been changed. The binary representation of the lowest bit count included in this range is 0.01 (binary number)=0.25 (decimal number), and hence the result of the coding is "01".

Figure 19A:
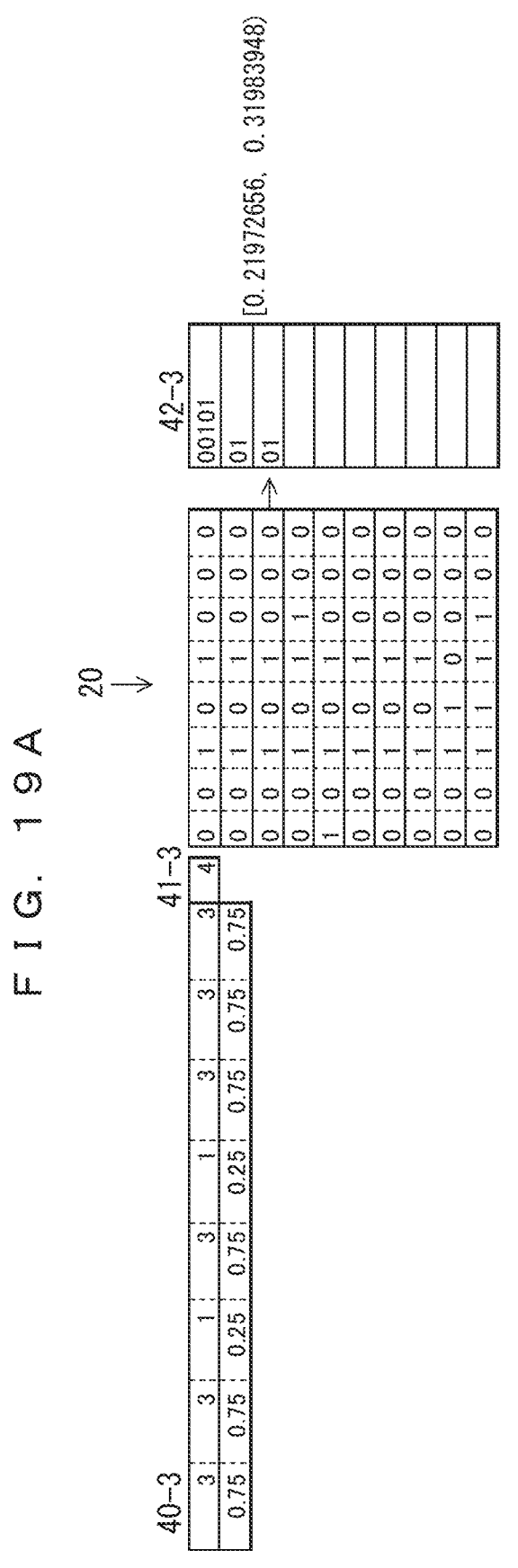

The table 40-3 in FIG. 19A indicates the frequencies of occurrence and probabilities of occurrence of the third record updated after the second record is coded. In the table 40-3, only the frequencies of the sections at which "0" occurred in the second record have been incremented by 1, i.e., those sections have been increased to 3. The initial value is maintained for the frequencies of the third and fifth bits at which "1" occurred. The total record count 41-2 has been increased to 4. The lower side of the table 40-3 indicates the probabilities of occurrence determined from the frequencies and the total record count. The result of the arithmetic coding performed according to the probabilities of occurrence is indicated in association with the third record in the third of coded data 42-3. This indicates that the value of the range of the arithmetic coding has been changed. Since 0.01 (binary number)=0.25 (decimal number), the result of the coding is "01".

Figure 19B:
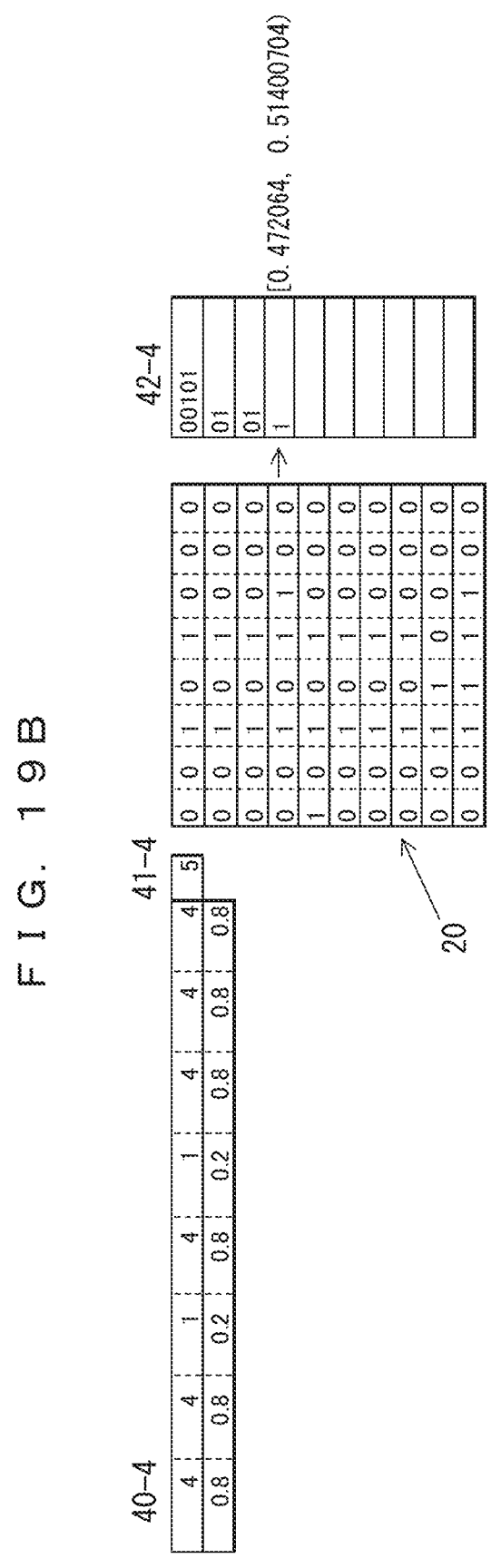

The table 40-4 in FIG. 19B indicates the frequencies of occurrence and probabilities of occurrence of the fourth record updated after the third record is coded. In the table 40-4, only the frequencies of the sections at which "0" occurred in the third record have been incremented by 1, i.e., those sections have been increased to 4. The initial value is maintained for the frequencies of the third and fifth bits at which "1" occurred. The total record count 41-4 has been increased to 5. The lower side of the table 40-4 indicates the probabilities of occurrence determined from the frequencies and the total record count. The result of the arithmetic coding performed according to the probabilities of occurrence is indicated in association with the fourth record in the fourth of coded data 42-4. This indicates that the value of the range of the arithmetic coding has been changed. Since 0.1 (binary number)=0.5 (decimal number), the result of the coding is "1".

The table 40-5 in FIG. 20A indicates the frequencies of occurrence and probabilities of occurrence of the fifth record updated after the fourth record is coded. In the table 40-5, only the frequencies of the sections at which "0" occurred in the fourth record have been incremented by 1, i.e., those sections have been increased to 5. The previous values are maintained for the frequencies of the third, fifth, and sixth bits at which "1" is occurred in the fourth record. The total record count 41-5 has been increased to 6. The lower side of the table 40-5 indicates the probabilities of occurrence determined from the frequencies and the total record count. The result of the arithmetic coding performed according to the probabilities of occurrence is indicated in association with the fifth record in the fifth of coded data 42-5. This indicates that the value of the range of the arithmetic coding has been changed. Since 0.111 (binary number)=0.875 (decimal number), the result of the coding is "111".

Figure 20B:
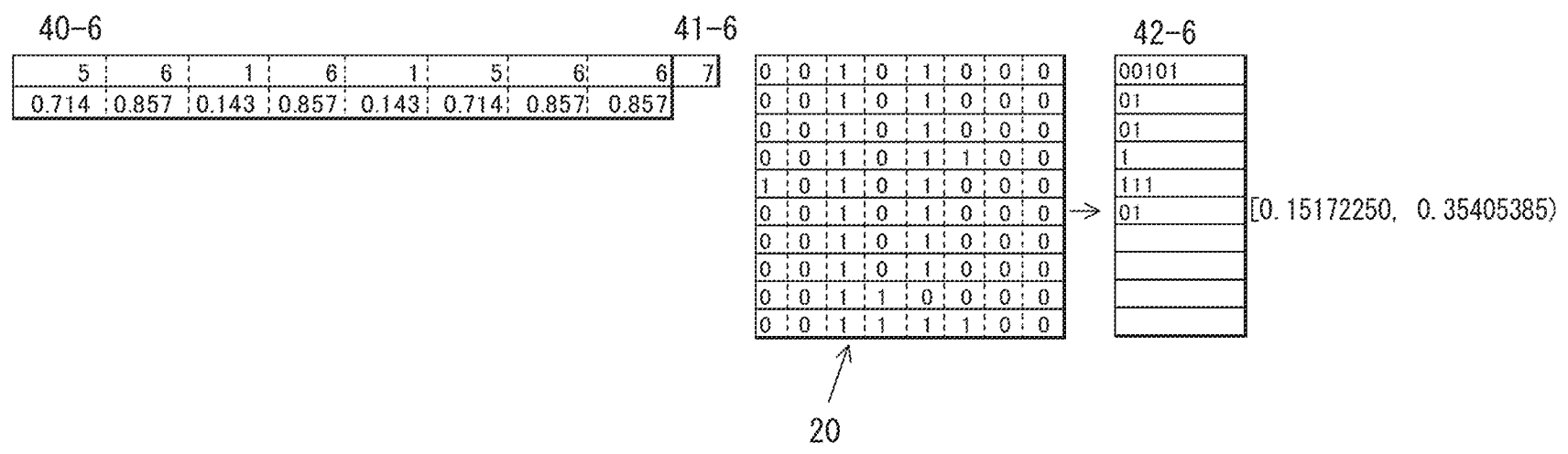

The table 40-6 in FIG. 20B indicates the frequencies of occurrence and probabilities of occurrence of the sixth record updated after the fifth record is coded. In the table 40-6, only the frequencies of the sections at which "0" occurred in the fifth record have been incremented by 1. The previous values are maintained for the frequencies of the first, third, and fifth bits at which "1" is occurred in the fifth record. The total record count 41-6 has been increased to 7. The lower side of the table 40-6 indicates the probabilities of occurrence determined from the frequencies and the total record count. The result of the arithmetic coding performed according to the probabilities of occurrence is indicated in association with the sixth record in the sixth of coded data 42-6. This indicates that the value of the range of the arithmetic coding has been changed. Since 0.01 (binary number)=0.25 (decimal number), the result of the coding is "01".

Figure 21A:
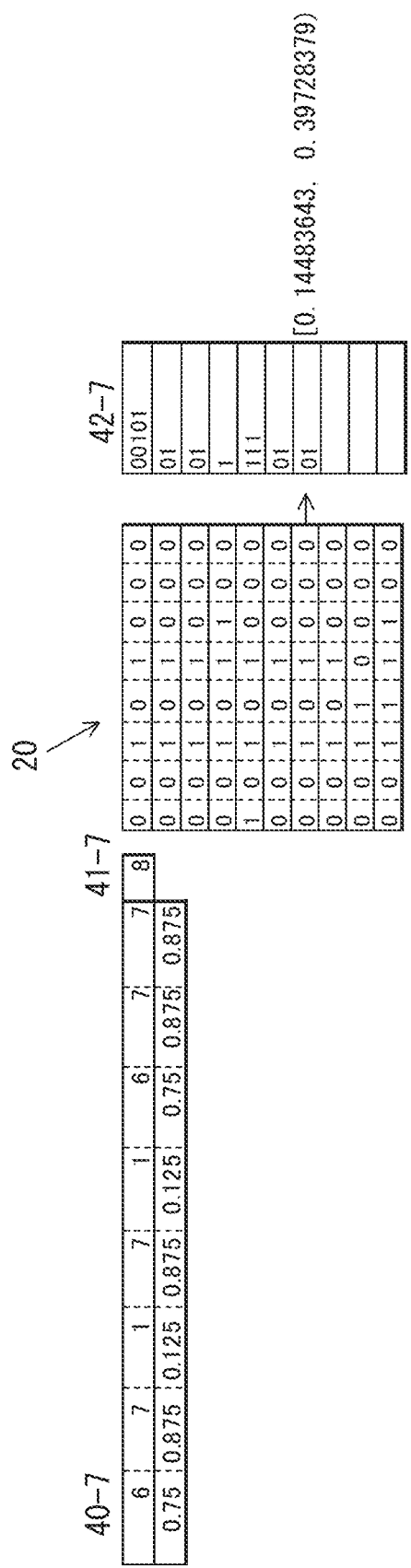
FIG. 21A illustrates, on the basis of a specific example, a data compression coding method of the embodiment with column division performed on a bit-by-bit basis (stage 7)

The table 40-7 in FIG. 21A indicates the frequencies of occurrence and probabilities of occurrence of the seventh record updated after the sixth record is coded. In the table 40-7, only the frequencies of the sections at which "0" occurred in the sixth record have been incremented by 1. The previous values are maintained for the frequencies of the third and fifth bits at which "1" is occurred in the sixth record. The total record count 41-7 has been increased to 8. The lower side of the table 40-7 indicates the probabilities of occurrence determined from the frequencies and the total record count. The result of the arithmetic coding performed according to the probabilities of occurrence is indicated in association with the seventh record in the seventh of coded data 42-7. This indicates that the value of the range of the arithmetic coding has been changed. Since 0.01 (binary number)=0.25 (decimal number), the result of the coding is "01".

Figure 21B:
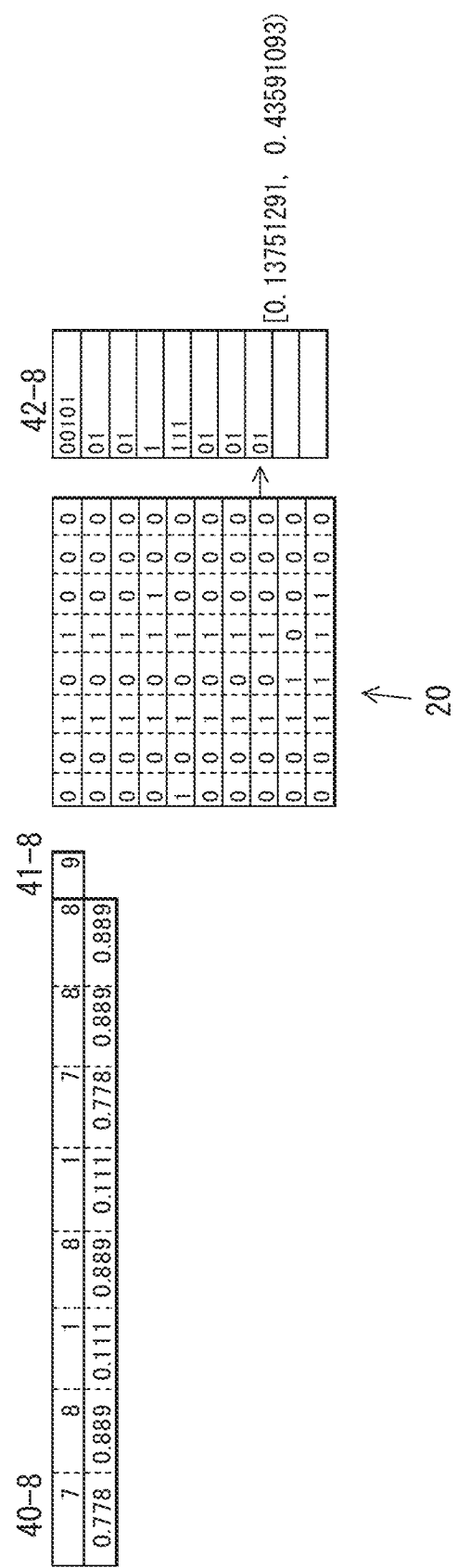
FIG. 21B illustrates, on the basis of a specific example, a data compression coding method of the embodiment with column division performed on a bit-by-bit basis (stage 8)

The table 40-8 in FIG. 21B indicates the frequencies of occurrence and probabilities of occurrence of the eighth record updated after the seventh record is coded. In the table 40-8, only the frequencies of the sections at which "0" occurred in the seventh record have been incremented by 1. The previous values are maintained for the frequencies of the third and fifth bits at which "1" is occurred in the seventh record. The total record count 41-8 has been increased to 9. The lower side of the table 40-8 indicates the probabilities of occurrence determined from the frequencies and the total record count. The result of the arithmetic coding performed according to the probabilities of occurrence is indicated in association with the eighth record in the eighth of coded data 42-8. This indicates that the value of the range of the arithmetic coding has been changed. Since 0.01 (binary number)=0.25 (decimal number), the result of the coding is "01".

The table 40-9 in FIG. 22A indicates the frequencies of occurrence and probabilities of occurrence of the ninth record updated after the eighth record is coded. In the table 40-9, only the frequencies of the sections at which "0" occurred in the eighth record have been incremented by 1. The previous values are maintained for the frequencies of the third and fifth bits at which "1" is occurred in the eighth record. The total record count 41-9 has been increased to 10. The lower side of the table 40-9 indicates the probabilities of occurrence determined from the frequencies and the total record count. The result of the arithmetic coding performed according to the probabilities of occurrence is indicated in association with the ninth record in the ninth of coded data 42-9. This indicates that the value of the range of the arithmetic coding has been changed. Since 0.10101 (binary number)=0.65625 (decimal number), the result of the coding is "10101".

Figure 22B:
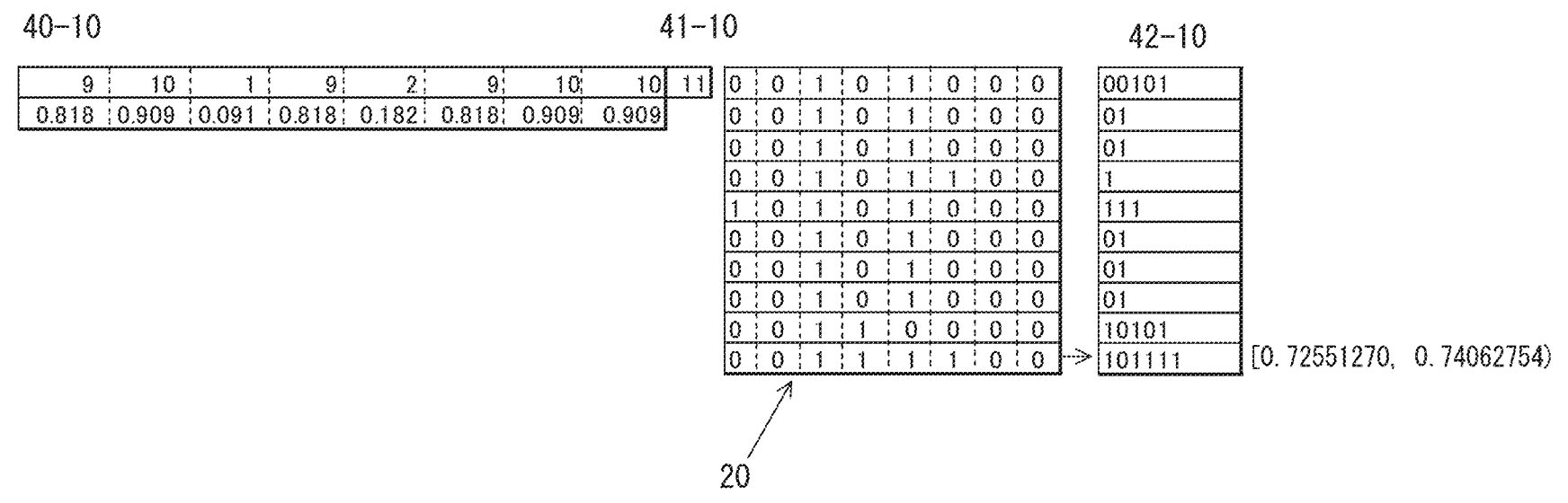

The table 40-10 in FIG. 22B indicates the frequencies of occurrence and probabilities of occurrence of the tenth record updated after the ninth record is coded. In the table 40-10, only the frequencies of the sections at which "0" occurred in the ninth record have been incremented by 1. The previous values are maintained for the frequencies of the third and fourth bits at which "1" is occurred in the ninth record. The total record count 41-10 has been increased to 11. The lower side of the table 40-10 indicates the probabilities of occurrence determined from the frequencies and the total record count. The result of the arithmetic coding performed according to the probabilities of occurrence is indicated in association with the tenth record in the tenth of coded data 42-10. This indicates that the value of the range of the arithmetic coding has been changed. Since 0.101111 (binary number)=0.734375 (decimal number), the result of the coding is "101111".

As described above, coding is performed by repeating the update of frequencies and the arithmetic coding.

The following advantage is provided by using the arithmetic coding based on the above-described division performed on a bit-by-bit basis.

In particular, in a case where the entirety of a record is considered to be one column, a compression similar to the compression that can be achieved in the prior art would be achieved; by contrast, the size of a frequency table required in examples of the present embodiment is 8+1=9 when a record of eight bits is divided on a bit-by-bit basis, in comparison with the prior art, in which a size of 256 would be necessary. The probabilities of occurrence can be calculated from the frequency table and thus do not need to be stored.

If a record length is 32 bits, 33 bits are required for a frequency table in examples of the present embodiment, while $2^{32}$=4294967296 bits are required in the prior art, and hence a method in which the entirety of a record is deemed as one column cannot be used in practice for data with a long record. Methods of examples of the present embodiment provide a better compression effect than a method that uses the conventional compression technique in which one type of dictionary is provided for the entirety when dividing is performed.

Compression-coding data in a column direction by dividing the data on a bit-by-bit basis provides the following advantageous effect. When, for example, data is divided into a plurality of bits, pieces of information to be replaced for coding need to be held for the patterns of the bits for the division units; by contrast, in the case of one-bit unit, it is sufficient to hold only information indicating whether one bit is "1" or not, and hence only a small capacity of working memory would be needed for compression coding. When data is divided into a plurality of bits, one record of data needs to be compression-coded by replacing symbols for the individual division units; by contrast, when data is divided on a bit-by-bit basis, compression coding can be performed by simply obtaining the bit count of one record and the bit count of "1" or "0", and hence only a simple logic will be necessary for the compression coding.

FIGS. 23A-31B illustrate exemplary processes of a decoding method that corresponds to the data compression coding method of the present embodiment.

FIGS. 23A and 23B each illustrate a decoding method of decoding coded data that has been coded by using the accumulative Huffman coding method depicted in FIGS. 14A to 14C.

It is determined in advance that coded data that has been coded by using the accumulative Huffman coding method depicted in FIGS. 14A to 14C is to be decoded, i.e., a record of eight bits consisting of two four-bit columns is to be treated. A scheme for determining Huffman codes is also determined in advance.

In addition, a memory area of a decoding dictionary 50-1 depicted in FIG. 23A is prepared on the decoding side in advance. On the basis of the arrangement indicated above, a table consisting of two blocks each having sixteen ($2^4$) rows is provided. The columns other than the column a in the table are blank.

Next, the frequencies of occurrence of symbols created via coding are read into column b. In this case, thirty-two integer values are read. On the basis of the frequencies of occurrence, the probabilities of occurrence of column c are calculated, a Huffman tree is created, and Huffman codes are determined for column e so as to complete the decoding dictionary 50-1. The procedure for calculating Huffman codes need to be the same as the procedure for coding. The decoding dictionary 50-1 is the same as the code dictionary 25 depicted in FIG. 14B.

There is also a method in which the probabilities of occurrence of column c, not the frequencies of occurrence of column b, are communicated. The Huffman code table of column e may be communicated, and in this case, a scheme for determining Huffman codes does not need to be determined in advance.

Next, a coded bit string is read, and decoded data is determined from the decoding dictionary 50-1. Huffman codes are prefix codes, and hence the coded bit string can be decoded in order starting from the head. No special delimiters are necessary.

FIG. 23B illustrates a decoded record 51-2 obtained by decoding coded data 51-1 using the decoding dictionary 50-1. In the first row of coded data 51-1, the coded data is "00". In the columns a and e of the decoding dictionary 50-1, the coded data "0" in the left column corresponds to symbol string"0010", and the coded data "0" in the right column corresponds to symbol string"1000". Accordingly, the coded data "00" becomes "00101000" after decoding. This is also applicable up to the third row of coded data 51-1.

The fourth row of coded data 51-1 is "010". According to the decoding dictionary 50-1, the code "01" is not present in the left column; accordingly, "0" is taken as the coded data of the left column. This corresponds to "0010" after decoding. The coded data of the right column is "10", and hence the data is "1100" after decoding according to the decoding dictionary 50-1. Accordingly, the symbol string after decoding is "00101100". After this, coded data 51-1 can be decoded in the same manner.

FIGS. 24A to 26B illustrate a decoding method of decoding coded data that has been coded by using the adaptive Huffman coding method depicted in FIGS. 15A to 17B.

It is determined in advance that coded data that has been coded using the accumulative Huffman coding method depicted in FIGS. 15A to 17B is to be decoded, i.e., a record of eight bits consisting of two four-bit columns is to be treated. A scheme for determining Huffman codes is also determined in advance.

A table 50-2 depicted in FIG. 24A is prepared on the decoding side in advance. On the basis of the arrangement indicated above, a table consisting of two blocks each having sixteen ($2^4$) rows is provided. In this method, a frequency table is not communicated in advance, and accordingly Huffman codes are calculated with the initial values of all frequencies of occurrence set to "1" using Laplace smoothing, as in the case of coding. As a result, the same table as the coding table 30-1 in the initial state depicted in FIG. 15A is created.

Data of column a is decoded data when it is determined from the corresponding data of column e of the table 50-2 at the moment at which the initial coded data "00101000" is read into the area 51-2. This is performed for the right and left columns, and two pieces of decoded data are coupled on a table 51-3 so that the record before the coding can be decoded. Huffman codes are prefix codes, and hence the coded bit string can be decoded in order starting from the head. Accordingly, no special delimiters are necessary.

The decoded data of the left column is "0010", and the decoded data of the right column is "1000". Hence, the frequencies in corresponding sections of the table 50-2 are incremented by 1. On the basis of the incremented frequencies, Huffman codes in the table 50-3 depicted in FIG. 24B are determined.

Next, the data "010101" of the second record is read. First, the first column of the second record is decoded from the column e on the left side of the table 50-2. In particular, "010" is found by searching from the head of the coded data in column e, thereby determining that "010" corresponds to the data "0010" after decoding in the table 50-3. Subsequently, the second column is decoded from the column e on the right side. In particular, in view of the fact that the remainder of the coded data is "101", it can be determined according to the table 50-3 that "101" corresponds to "1000". Accordingly, it is determined that the data of the right column after decoding is "1000". Then, the symbol strings of the right and left columns after decoding are coupled, thereby obtaining "00101000". After this, the table 50-3 is updated. Huffman codes are prefix codes, and hence no delimiters are necessary. Decoding can be performed by repeating this process.

In FIG. 25A, the third coded data is "001001". Hence, it can be determined that "001" corresponds to "0010" according to the left column of a table 50-4 and that "001" corresponds to "1000" according to the right column. Accordingly, the third symbol string after coding is "00101000".

As depicted in FIG. 25B, the fourth coded data is "00100010". Hence, according to a table 50-5, it can be determined that the "001" of the left column corresponds to "0010" and that the "00010" of the right column corresponds to "1100". Accordingly, it can be determined that the fourth symbol string after coding is "00101100".

As depicted in FIG. 26A, the fifth coded data is "0000011". Hence, it can be determined that "00000" corresponds to "1010" according to the left column of a table 50-6 and that "11" corresponds to "1000" according to the right column. Accordingly, the fifth symbol string after decoding is "10101000".

The sixth coded data is "0101". Hence, according to a table 50-7, it can be determined that the "01" of the left column corresponds to "0010" and that the "01" of the right column corresponds to "1000". Accordingly, it can be determined that the sixth symbol string after decoding is "00101000". All records can be decoded by repeating the process described above.

FIGS. 27A to 31B illustrate a decoding method of decoding coded data that has been coded by using the adaptive arithmetic coding method depicted in FIGS. 18A to 22B.

It is determined in advance that coded data that has been coded by using the accumulative arithmetic coding method depicted in FIGS. 18A to 22B is to be decoded, i.e., a record of eight bits consisting of eight one-bit columns is to be treated. A scheme for arithmetic coding is also determined in advance.

A table 60-1 depicted in FIG. 27A is prepared on the decoding side in advance. On the basis of the arrangement indicated above, a table consisting of eight blocks is provided. Each block would be necessary for two patterns, a pattern in which column data is "0" and a pattern in which column data is "1"; however, as in the case of coding, only a pattern in which column data is "0" is stored and a section for total coded data count 61-1 is provided. In the adaptive method, a frequency table is not communicated in advance, and accordingly the probabilities of occurrence are calculated with the initial values of all frequencies of occurrence set to "1" using Laplace smoothing, as in the case of coding. This is indicated in the table 60-1 depicted in FIG. 27A.

Here, the coded data "00101" of the first record is read into a region 61-2. Arithmetic codes are not prefix codes, and hence a protocol that allows record delimiters to be determined needs to be used.

When received data "00101" is interpreted as a binary fraction, coded data 0.15625 is obtained. Dividing the range using a method similar to that for the arithmetic coding while determining column values on the basis of the obtained data provides decoded data "00101000", which is a record before coding, as indicated in a table 61-3.

The record count is incremented by 1, the frequencies of the columns of "0" in the decoded data "00101000" are incremented by 1, and the probabilities of occurrence are newly calculated. This is reflected in the table 60-2 indicated in FIG. 27B.

Next, the data "01" of the second record is read.

When received data "01" is interpreted as a binary fraction, coded data 0.25 is obtained. Dividing the range using a method similar to that for the arithmetic coding while determining column values on the basis of the obtained data provides decoded data "00101000". Just to make certain, the following describes in detail exemplary processes for obtaining the second decoded data.

Figure 27B:
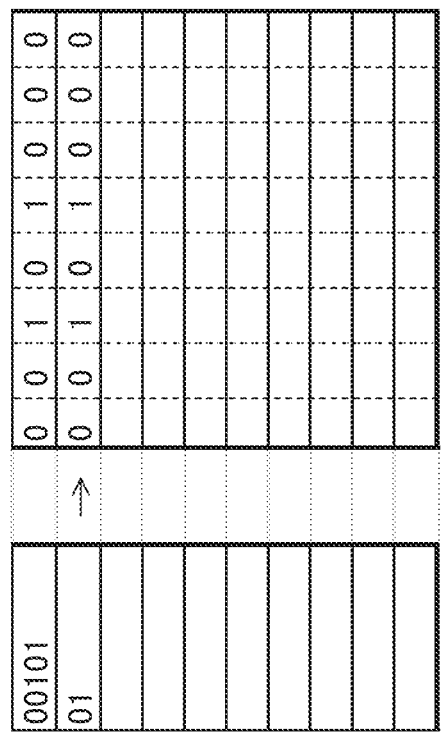
FIG. 27B illustrates, on the basis of a specific example, a decoding method of coded data that has been coded by an adaptive arithmetic coding method of the embodiment (stage 2)
Figure 31A:
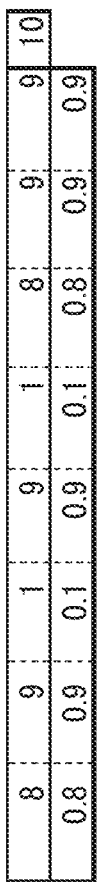
FIG. 31A illustrates, on the basis of a specific example, a decoding method of coded data that has been coded by an adaptive arithmetic coding method of the embodiment (stage 9)

The table 60-2 describes the frequencies indicated in FIG. 27B according to input of the first coded data. The second coded value "01" that has been input corresponds to the decimal part of a binary fraction of 0.01 and is 0.25 in decimal notation. On the basis of the value in decimal notation of "0.25" and the probability of occurrence of "0" for individual columns (bits) determined from the frequency of "0" of individual decoded columns, decoded data is sequentially determined for each bit. The initial value of the range in decoding the initial bit is [0,1). Range dividing is repeated in accordance with the probability of occurrence of "0" for individual columns. A dividing value is calculated according to a formula of "{(highest value of range)−(lowest value of range)}*(probability of "0")+(lowest value of range)".

First, a probability of occurrence of "0.667" is determined, as described in the table 60-2, from "2" held in the first column of the table 60-2, i.e., the frequency of "0", and "3", i.e., a record count held in total coded data count of the table 60-2, and the dividing value of the current range is determined according to the formula above. The current range is [0,1), i.e., the initial value, and hence the calculated dividing value is "0.667". The process of determining the dividing value corresponds to the process performed by the column division span determination means 20-1 depicted in FIG. 5B. (The probability of occurrence may be calculated in advance when the frequency is updated.)

The value of each column of the decoded record is "0" when (code value)≤(dividing value) and is "1" when (code value)>(dividing value). In the current situation, since the dividing value is "0.667" and the code value is "0.25", the decoded bit values of the initial column are "0". This process corresponds to the process performed by the column-1 decoding means 14a-1 depicted in FIG. 5B. Since the bit value and dividing value of the initial column are respectively "0" and "0.667", the next range is [0, 0.667), i.e., a span smaller than the dividing value. This process corresponds to the process performed by the range division means 21-1 depicted in FIG. 5B.

Next, the dividing value "0.444" of the current range [0, 0.667) is determined from the frequency of occurrence of "0" in the second column of the table 60-2, and the decoded bit value of the second column is "0" according to a relationship in magnitude between the dividing value and the code value "0.25". According to the decoded bit value, the next range is [0, 0.444). The processes for the second column correspond to the processes performed by the column division span determination means 20-2, column-2 decoding means 14a-2, and range division means 21-2 depicted in FIG. 5B, as with the processes for the initial column.

In a manner similar to that described above, the dividing value [0.148] of the current range [0, 0.444) is determined from the frequency of occurrence of "0" in the third column of the table 60-2, and the decoded bit value of the third column is "1" according to a relationship in magnitude between the dividing value and the code value "0.25". According to the decoded bit value, the next range is [0.148, 0.444).

The decoding of one record is completed by repeating the processes described above sequentially for the individual columns.

Pieces of column data sequentially decoded as described above are mixed by the mixture means 17a depicted in FIG. 5B so as to provide decoded data of one record.

Next, the record count in the table 60-2 depicted in FIG. 27B is incremented by 1, the frequencies of the columns of "0" in the second decoded data "00101000" are incremented by 1, and the probabilities of occurrence are newly calculated. This is reflected in the table 60-3 indicated in FIG. 28A.

Next, the data "01" of the third record is read. When received data "01" is interpreted as a binary fraction, coded data 0.25 is obtained. Decoded data "00101000" is determined by dividing the range using a method similar to that for the second record while judging column values by the obtained data.

The record count is incremented by 1, the frequencies of the columns of "0" in the decoded data "00101000" are incremented by 1, and the probabilities of occurrence are newly calculated. This is reflected in the table 60-4 indicated in FIG. 28B.

Next, the data "1" of the fourth record is read. When received data "1" is interpreted as a binary fraction, coded data 0.5 is obtained. Decoded data "00101100" is determined by dividing the range using a method similar to that described above while judging column values by the obtained data.

The record count is incremented by 1, the frequencies of the columns of "0" in the decoded data "00101100" are incremented by 1, and the probabilities of occurrence are newly calculated. This is reflected in the table 60-5 indicated in FIG. 29A.

Next, the data "111" of the fifth record is read. When received data "111" is interpreted as a binary fraction, coded data 0.875 is obtained. Decoded data "10101000" is determined by dividing the range using a method similar to that described above while judging column by the obtained data.

The record count is incremented by 1, the frequencies of the columns of "0" in the decoded data "10101000" are incremented by 1, and the probabilities of occurrence are newly calculated. This is reflected in the table 60-6 indicated in FIG. 29B.

Next, the data "01" of the sixth record is read. When received data "01" is interpreted as a binary fraction, coded data 0.25 is obtained. Decoded data "00101000" is determined by dividing the range using a method similar to that described above while judging column values by the obtained data.

The record count is incremented by 1, the frequencies of the columns of "0" in the decoded data "00101000" are incremented by 1, and the probabilities of occurrence are newly calculated. This is reflected in the table 60-7 indicated in FIG. 30A.

Next, the data "01" of the seventh record is read. When received data "01" is interpreted as a binary fraction, coded data 0.25 is obtained. Decoded data "00101000" is determined by dividing the range using a method similar to that described above while judging column values by the obtained data.

The record count is incremented by 1, the frequencies of the columns of "0" in the decoded data "00101000" are incremented by 1, and the probabilities of occurrence are newly calculated. This is reflected in the table 60-8 indicated in FIG. 30B.

Next, the data "01" of the eighth record is read. When received data "01" is interpreted as a binary fraction, coded data 0.25 is obtained. Decoded data "00101000" is determined by dividing the range using a method similar to that described above while judging column values by the obtained data.

The record count is incremented by 1, the frequencies of the columns of "0" in the decoded data "00101000" are incremented by 1, and the probabilities of occurrence are newly calculated. This is reflected in the table 60-9 indicated in FIG. 31A.

Next, the data "10101" of the ninth record is read. When received data "10101" is interpreted as a binary fraction, coded data 0.65625 is obtained. Decoded data "00110000" is determined by dividing the range using a method similar to that described above while judging column values by the obtained data.

The record count is incremented by 1, the frequencies of the columns of "0" in the decoded data "00110000" are incremented by 1, and the probabilities of occurrence are newly calculated. This is reflected in the table 60-10 indicated in FIG. 31B.

Next, the data "101111" of the tenth record is read. When received data "101111" is interpreted as a binary fraction, coded data 0.734375 is obtained. Decoded data "00111100" is determined by dividing the range using a method similar to that described above while judging column values by the obtained data.

FIG. 32 is a hardware environment diagram of an exemplary computer for executing a program in implementing the embodiments by using the program.

An exemplary computer 60 includes, for example, a CPU 50, a ROM 51, a RAM 52, a network interface 53, a storage apparatus 56, a read/write drive 57, an input/output device 59. These are connected to each other by a bus 55.

The CPU 50 executes a program for implementing the present embodiment. The program is recorded in the storage apparatus 56 or a portable recording medium 58 and loaded into the RAM 52 so that the CPU 50 can execute the program.

The storage apparatus 56 is, for example, a hard disk. The portable recording medium 58 includes a magnetic disk such as a flexible disk, an optical disc such as a CD-ROM, a DVD, or a Blu-Ray, a semiconductor memory such as an IC memory, or the like and is inserted into the read/write drive 57 so as to write data to or read data from the portable recording medium 58. In the present embodiment, a program for implementing the embodiment is recorded in the storage apparatus 56 and the portable recording medium 58, and in addition, input fixed length data to be coded may be temporarily recorded in the storage apparatus 56 and the portable recording medium 58 and then read into the RAM 52 so as to be coded.

The ROM 51 has stored therein basic programs such as BIOS for performing a communication via the bus 55 and performing the functions of the network interface 53 and the input/output device 59. The basic functions of the exemplary computer 60 are achieved by the CPU 50 performing the basic programs.

The input/output device 59 is used to receive input of information from a user of the exemplary computer 60 or to output information for the user. The input/output device 59 includes, for example, a keyboard, a mouse, a touch panel, a display, and a printer.

The network interface 53 is used to allow the exemplary computer 60 to communicate with another computer, a network apparatus, or the like over a network 54. In the present embodiment, a program for implementing the embodiment may be recorded in the storage apparatus 56 or the portable recording medium 58 over the network 54. A program for implementing the embodiment may be executed on another computer or network apparatus connected to the network 54, and the input or output data may be transmitted or received via the network 53. In addition, fixed length data to be coded can be transmitted from a terminal provided with a sensor connected to the network 54.

The network 54 may be any network such as a wired or wireless network over which computers or a computer and a network apparatus can communicate with each other. In one example, the network 54 may include the Internet, a local area network (LAN), a wide area network (WAN), a landline telephone network, a cellular telephony network, an ad-hoc network, a virtual private network (VPN), and a sensor network.

As described above, in the embodiment in accordance with an aspect of the invention, when a fixed-length bit string of fixed length data includes data having different meanings described in a plurality of determined fields with each piece of fixed length data having the same type of data described in a field at the same position, the fixed-length bit string of fixed length data is divided into columns with an arbitrary number of bits, wherein mutual columns are individually coded in a continuous manner in a column direction so as to achieve compression coding with a compressibility that is higher than the conventional coding method.

As examples of improvement in the compressibility, experimental models of a compression coding apparatus that relies on the present embodiment provided by the inventor compressed 70,016 bytes of original data and 560,128 bits of original data to 13,532 bytes and 94,000 bits (not including padding bits). Those pieces of original data were compressed to 14,464 bytes and 115,712 bits according to gzip and compressed to 12,985 bytes and 103,880 bits according to bzip2, and this clarifies the effectiveness of the compression coding method of the embodiment.

The coding apparatus of the present embodiment may be implemented by hardware such as a field programmable gate array (FPGA).

For example, the coding apparatus of the embodiment may include a portion achieved by hardware, another portion achieved by software, and still another portion achieved by a combination of hardware and software.

The embodiments described above may be achieved independently from each other or may be achieved in combination with each other.

In embodiments in which an adaptive coding method is used, among the embodiments described above, compression coding can be successively performed, and data does not need to be temporarily collectively stored, so that coding can be performed in real time. In applying the embodiments to real-time coding, a predetermined number of records sequentially input are compressed in a column direction virtually as tabular data.

What is claimed is:

1. A data compression coding method executed by a computer, the method comprising:
   an accumulation step of temporarily, by the computer, accumulating a predetermined number of two or more records consisting of a fixed-length bit string that includes one or more fields in which pieces of data having an identical attribute among a plurality of pieces of data sequentially transmitted from a transmission source are contained;
   a division step of dividing, by the computer, the predetermined number of two or more records into columns each with a predetermined bit width, independently of boundaries between the fields; and
   a coding step of determining, by the computer for each of the columns, a probability of occurrence of a bit value in a column at a same position among the predetermined number of two or more records, of creating, for each of the columns, a coding table for an entropy coding method on the basis of the probability of occurrence, of coding, for each of the predetermined number of two or more records, the columns constituting the record using the coding table created for each of the columns, and of outputting, for each of the records, coded data obtained by coupling the coded columns,
   wherein the accumulation step, the division step, and the coding step are repeated by the computer.

2. A non-transitory processor-readable medium having computer code embodied thereon, the computer code when executed by the computer causes the computer to execute the data compression-coding method of claim 1.

3. A data compression coding apparatus comprising:
   an accumulation means for temporarily accumulating a predetermined number of two or more records consisting of a fixed-length bit string that includes one or more fields in which pieces of data having an identical attribute among a plurality of pieces of data sequentially transmitted from a transmission source are contained;
   a division means for dividing the predetermined number of two or more records into columns each with a predetermined bit width, independently of boundaries between the fields; and
   a coding means for determining, for each of the columns, a probability of occurrence of a bit value in a column at a same position among the predetermined number of two or more records, for creating, for each of the columns, a coding table for an entropy coding method on the basis of the probability of occurrence, for coding, for each of the predetermined number of two or more records, the columns constituting the record using the coding table created for each of the columns, and for outputting, for each of the records, coded data obtained by coupling the coded columns,
   wherein the processes performed by the accumulation means, the division means, and the coding means are repeated.

4. A data compression coding method executed by a computer of compression-coding and outputting records consisting of a fixed-length bit string that includes one or more fields in which pieces of data having an identical attribute among pieces of data sequentially transmitted from a transmission source are contained, the data compression coding method comprising:
   a division step of dividing, by the computer, the records into columns each with a predetermined bit width, independently of boundaries between the fields;
   a coding step of determining, by the computer for a record input at a present time and for each of the columns, a probability of occurrence of a bit value in a column at a same position among records that have been input by that moment, and coding each of the columns constituting the record on the basis of the probability of occurrence using an adaptive entropy coding method; and
   an outputting step of immediately, by the computer, outputting coded data obtained by coupling the coded columns,
   wherein the division step, the coding step, and the outputting step are repeated by the computer for a predetermined number of records.

5. The data compression coding method of claim 4, wherein the bit width of each of the columns is one, the coding step codes the records on the basis of the probability of occurrence using an arithmetic coding method, instead of coding each of the columns constituting the record on the basis of the probability of occurrence using an adaptive entropy coding method, and the outputting step immediately outputs the record coded in the coding step.

6. A non-transitory processor-readable medium having computer code embodied thereon, the computer code when executed by the computer causes the computer to execute perform the data compression coding method of claim 5.

7. A non-transitory processor-readable medium having computer code embodied thereon, the computer code when executed by the computer causes the computer to execute the data compression-coding method of claim 4.

8. A data compression coding apparatus that compression-codes and outputs records consisting of a fixed-length bit string that includes one or more fields in which pieces of data having an identical attribute among pieces of data sequentially transmitted from a transmission source are contained, the data compression coding apparatus comprising:

a division means for dividing the records into columns each with a predetermined bit width, independently of boundaries between the fields;

a coding means for determining, for a record input at a present time and for each of the columns, a probability of occurrence of a bit value in a column at a same position among records that have been input by that moment, and for coding each of the columns constituting the record on the basis of the probability of occurrence using an adaptive entropy coding method; and an outputting means for immediately outputting coded data obtained by coupling the coded columns, wherein the processes performed by the division means, the coding means, and the outputting means are repeated for a predetermined number of records.

9. The data compression coding apparatus of claim 8, wherein the bit width of each of the columns is one, the coding means codes the records on the basis of the probability of occurrence using an arithmetic coding method, instead of coding each of the columns constituting the record on the basis of the probability of occurrence using an adaptive entropy coding method, and the outputting means immediately outputs the record coded by the coding means.

* * * * *

UNITED STATES PATENT AND TRADEMARK OFFICE
CERTIFICATE OF CORRECTION

PATENT NO. : 10,547,324 B2
APPLICATION NO. : 16/235741
DATED : January 28, 2020
INVENTOR(S) : Takayuki Suzuki et al.

Page 1 of 1

It is certified that error appears in the above-identified patent and that said Letters Patent is hereby corrected as shown below:

On the Title Page

Please add:
(30) Foreign Application Priority Data
July 25, 2016 (JP)………………………..2016-145397

Signed and Sealed this
Seventeenth Day of March, 2020

Andrei Iancu
*Director of the United States Patent and Trademark Office*